(12) United States Patent
Lee et al.

(10) Patent No.: US 12,131,702 B2
(45) Date of Patent: Oct. 29, 2024

(54) DISPLAY DEVICE

(71) Applicant: Samsung Display Co., LTD., Yongin-si (KR)

(72) Inventors: Ji Hye Lee, Yongin-si (KR); Kyung Bae Kim, Yongin-si (KR); Ki Hyun Pyo, Yongin-si (KR); Sung Chul Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/107,659

(22) Filed: Feb. 9, 2023

(65) Prior Publication Data

US 2024/0013717 A1 Jan. 11, 2024

(30) Foreign Application Priority Data

Jul. 8, 2022 (KR) .......................... 10-2022-0084637

(51) Int. Cl.
*G09G 3/3233* (2016.01)
*H01L 25/16* (2023.01)
*H01L 27/12* (2006.01)

(52) U.S. Cl.
CPC ......... *G09G 3/3233* (2013.01); *H01L 25/167* (2013.01); *H01L 27/124* (2013.01); *G09G 2300/0426* (2013.01); *G09G 2300/0452* (2013.01); *G09G 2300/0819* (2013.01); *G09G 2300/0842* (2013.01)

(58) Field of Classification Search
CPC ......... G09G 3/3233; G09G 2300/0426; G09G 2300/0452; G09G 2300/0819; G09G 2300/0842; H01L 25/167; H01L 27/124
See application file for complete search history.

(56) References Cited

U.S. PATENT DOCUMENTS

| | | | | |
|---|---|---|---|---|
| 8,115,878 B2 * | 2/2012 | Chung | ................ | G02F 1/1362 |
| | | | | 257/E27.111 |
| 9,384,687 B2 * | 7/2016 | Lee | ......................... | G09G 3/20 |
| 10,453,909 B2 * | 10/2019 | Li | ...................... | H01L 27/1244 |
| 10,727,290 B2 * | 7/2020 | Yamamoto | ........... | H10K 59/131 |
| 10,756,302 B2 * | 8/2020 | Paek | ..................... | H10K 50/813 |
| 10,943,947 B2 * | 3/2021 | Im | ....................... | H01L 33/0095 |
| 11,521,541 B2 * | 12/2022 | Park | ......................... | G09G 3/32 |
| 11,550,087 B2 * | 1/2023 | Park | ..................... | G09G 3/3607 |
| 11,716,882 B2 * | 8/2023 | Kim | ...................... | H10K 50/865 |
| | | | | 257/40 |

(Continued)

FOREIGN PATENT DOCUMENTS

KR 10-2022-0006164 1/2022

*Primary Examiner* — Michael J Jansen, II
(74) *Attorney, Agent, or Firm* — KILE PARK REED & HOUTTEMAN PLLC

(57) ABSTRACT

A display device includes a pixel including a first sub-pixel to third sub-pixels, each arranged in a first direction and emitting light of a color, a first to third vertical power lines, each extending in a second direction different from the first direction, overlapping the first to third sub-pixels, respectively, and transmitting first to third powers, respectively, a first to third horizontal power lines, each extending in the first direction and electrically connected to the first to third vertical power lines through a contact hole, respectively. Voltages of the first power, the second power, and the third power are different from each other.

20 Claims, 16 Drawing Sheets

(56) References Cited

U.S. PATENT DOCUMENTS

| | | | |
|---|---|---|---|
| 11,749,782 B2* | 9/2023 | Lee | H01L 33/24 |
| | | | 345/55 |
| 11,848,335 B2* | 12/2023 | Oh | H01L 24/25 |
| 2007/0252783 A1* | 11/2007 | Hashimoto | G09G 3/2942 |
| | | | 345/60 |
| 2011/0157503 A1* | 6/2011 | Chung | G09G 3/36 |
| | | | 257/E27.111 |
| 2014/0176399 A1* | 6/2014 | Lee | G09G 3/20 |
| | | | 345/55 |
| 2018/0226466 A1* | 8/2018 | Yamamoto | H10K 59/35 |
| 2018/0261663 A1* | 9/2018 | Li | H10K 59/122 |
| 2019/0207163 A1* | 7/2019 | Paek | H10K 50/852 |
| 2019/0326348 A1* | 10/2019 | Im | H01L 25/0753 |
| 2020/0365077 A1* | 11/2020 | Park | G09G 3/3225 |
| 2021/0151544 A1* | 5/2021 | Kim | H10K 50/865 |
| 2022/0011487 A1* | 1/2022 | Park | G09G 3/3607 |
| 2022/0336708 A1 | 10/2022 | Lee et al. | |
| 2022/0392923 A1* | 12/2022 | Oh | H01L 21/768 |
| 2023/0033385 A1* | 2/2023 | Park | H10K 59/122 |
| 2024/0013717 A1* | 1/2024 | Lee | H01L 25/0753 |

\* cited by examiner

DISPLAY DEVICE

CROSS-REFERENCE TO RELATED APPLICATION(S)

This application claims priority to and benefits of Korean Patent Application No. 10-2022-0084637 under 35 U.S.C. § 119(a), filed on Jul. 8, 2022, in the Korean Intellectual Property Office (KIPO), the entire contents of which are incorporated herein by reference.

BACKGROUND

1. Technical Field

The disclosure relates to a portable terminal using a flexible display device.

2. Description of the Related Art

Recently, as interest in information display is increased, research and development of a display device are continuously being conducted.

SUMMARY

An object of the disclosure is to provide a display device including sub-pixels having a unified power line disposition design under an alignment electrode, and supplying voltages of different power to vertical power lines passing through each of the sub-pixels.

Another object of the disclosure is to provide a display device in which a first horizontal power line is between a first pixel row and a second pixel row, and a second horizontal power line and a third horizontal power line is between the second pixel row and a third pixel row.

However, an object of the disclosure is not limited to the above-described objects, and may be variously expanded without departing from the spirit and scope of the disclosure.

According to embodiments of the disclosure, a display device may include pixel rows including a first pixel row, a second pixel row, and a third pixel row. Each of the pixel rows may include a pixel including a first sub-pixel, a second sub-pixel, and a third sub-pixel arranged in a first direction and emitting light of a first color, light of a second color, and light a third color, respectively, a first vertical power line extending in a second direction different from the first direction, overlapping the first sub-pixel in a thickness direction of the pixel, and transmitting first power, a second vertical power line extending in the second direction, overlapping the second sub-pixel in the thickness direction, and transmitting second power, a third vertical power line extending in the second direction, overlapping the third sub-pixel in the thickness direction, and transmitting third power, a first horizontal power line extending in the first direction and electrically connected to the first vertical power line through a first contact hole, a second horizontal power line extending in the first direction and electrically connected to the second vertical power line through a second contact hole, and a third horizontal power line extending in the first direction and electrically connected to the third vertical power line through a third contact hole. Voltages of the first power, the second power, and the third power may be different from each other According to an embodiment, each of the first sub-pixel, the second sub-pixel, and the third sub-pixel may include alignment electrodes disposed on the first to third vertical power lines and the first to third horizontal power lines, arranged in the first direction, and extending in the second direction, and light emitting elements disposed between adjacent alignment electrodes and arranged in the second direction, in a plan view.

According to an embodiment, a distance between the first vertical power line and the second vertical power line in the first direction and a distance between the second vertical power line and the third vertical power line in the first direction may be same.

According to an embodiment, shapes of the first vertical power line, the second vertical power line, and the third vertical power line in a plan view may be same.

According to an embodiment, the first horizontal power lines of the first pixel row and the second pixel row may be integral with each other and disposed between the first pixel row and the second pixel row adjacent to each other.

According to an embodiment, each of the first sub-pixel, the second sub-pixel, and the third sub-pixel may include a pixel circuit driving the light emitting elements, and each of the pixel circuit may include a first transistor including a first electrode electrically connected to the first horizontal power line and a second electrode electrically connected to the light emitting elements, and generating a driving current based on a data signal, a second transistor electrically connected between a gate electrode of the first transistor and a data line providing the data signal, and including a gate electrode electrically connected to a scan line extending in the first direction, a third transistor electrically connected between the third horizontal power line and the second electrode of the first transistor, and including a gate electrode electrically connected to the scan line, and a storage capacitor electrically connected between the gate electrode of the first transistor and the second electrode of the first transistor.

According to an embodiment, the pixel circuit of the first pixel row and the pixel circuit of the second pixel row may be symmetrical with respect to the first horizontal power line of the first pixel row, and the second horizontal power line, the third horizontal power line, and the scan line may not be disposed between the first pixel row and the second pixel row.

According to an embodiment, the first electrode of the first transistor of the first pixel row and the first electrode of the first transistor of the second pixel row may be integral with each other, and may be electrically connected to the first horizontal power line of the first pixel row through a fourth contact hole.

According to an embodiment, the second horizontal power lines of the second pixel row and the third pixel row may be integral with each other and disposed between the second pixel row and the third pixel row adjacent to each other.

According to an embodiment, the pixel circuit of the second pixel row and the pixel circuit of the third pixel row may be symmetrical with respect to the second horizontal power line of the second pixel row, and the first horizontal power line may not be disposed between the second pixel row and the third pixel row.

According to an embodiment, the display device may further include a scan line of the second pixel row and a scan line of the third pixel row, each disposed between the second pixel row and the third pixel row.

According to an embodiment, the third horizontal power line of the second pixel row and the third horizontal power line of the third pixel row may be disposed between the second pixel row and the third pixel row.

According to an embodiment, each of the first vertical power line, the second vertical power line, and the third vertical power line may be disposed in the pixel.

According to an embodiment, distances between adjacent ones of the alignment electrodes in the first direction may be same.

According to embodiments of the disclosure, a display device may include pixel rows including a first pixel row, a second pixel row, and a third pixel row. Each of the pixel rows may include a pixel including a first sub-pixel, a second sub-pixel, and a third sub-pixel arranged in a first direction and emitting light of a first color, light of a second color, and light a third color, respectively, a first vertical power line extending in a second direction different from the first direction, overlapping the first sub-pixel in a thickness direction of the pixel, and transmitting first power, a second vertical power line extending in the second direction, overlapping the second sub-pixel in the thickness direction, and transmitting second power, a third vertical power line extending in the second direction, overlapping the third sub-pixel in the thickness direction, and transmitting third power, a first horizontal power line extending in the first direction and electrically connected to the first vertical power line through a first contact hole, a second horizontal power line extending in the first direction and electrically connected to the second vertical power line through a second contact hole, and a third horizontal power line extending in the first direction and electrically connected to the third vertical power line through a third contact hole. The first horizontal power lines of the first pixel row and the second pixel row may be integral with each other and disposed between the first pixel row and the second pixel row adjacent to each other, the second horizontal power lines of the second pixel row and the third pixel row may be integral with each other and disposed between the second pixel row and the third pixel row adjacent to each other, and the third horizontal power lines of the second pixel row and the third pixel row may be disposed between the second pixel row and the third pixel row.

According to an embodiment, each of the first sub-pixel, the second sub-pixel, and the third sub-pixel may include a pixel circuit layer including transistors generating a driving current based on the first to third powers, and a display element layer disposed on the pixel circuit layer and including light emitting elements.

According to an embodiment, the pixel circuit of the first pixel row and the pixel circuit of the second pixel row may be symmetrical with respect to the first horizontal power line of the first pixel row, and the pixel circuit of the second pixel row and the pixel circuit of the third pixel row may be symmetrical with respect to the second horizontal power line of the second pixel row.

According to an embodiment, the display element layer may include alignment electrodes disposed between the pixel circuit layer and the light emitting elements, arranged in the first direction, and extending in the second direction.

According to an embodiment, voltages of the first power, the second power, and the third power may be different from each other.

According to an embodiment, a distance between the first vertical power line and the second vertical power line in the first direction and a distance between the second vertical power line and the third vertical power line in the first direction may be same.

In the display device according to embodiments of the disclosure, only one of each of vertical power lines respectively transmitting the first power, the second power, and the third power and extending in the second direction may be disposed in a pixel. Therefore, the number of lines in sub-pixels may be reduced and a design of the pixel circuit layer may be simplified. Also, planar and cross-sectional layouts of the pixel circuit layer of the sub-pixels may be unified. Therefore, a deviation between the sub-pixels of electric fields formed by the alignment electrodes may be minimized or reduced, and an alignment deviation of the light emitting elements between the sub-pixels may be minimized.

Since a planar shape of the pixel circuit layer is designed to be symmetrical with respect to horizontal power lines (for example, the first horizontal power line or the second horizontal power line), an integration degree of metal lines may be reduced. Therefore, a yield and resolution of the display device may be increased.

However, an effect of the disclosure is not limited to the above-described effect, and may be variously expanded without departing from the spirit and scope of the disclosure.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENT

Figure 1:
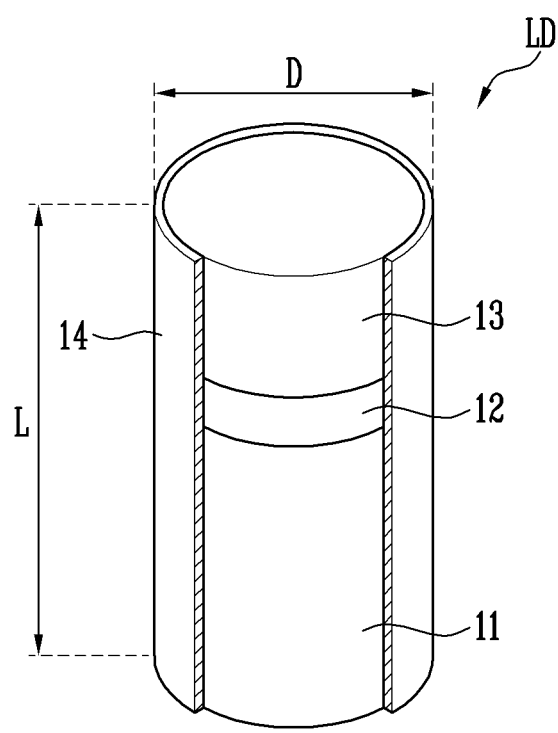
FIG. 1 is a perspective view schematically illustrating a light emitting element according to an embodiment of the disclosure.

Hereinafter, embodiments of the disclosure are described in more detail with reference to the accompanying drawings. The same reference numerals are used for the same components in the drawings, and a repeated description of the same components is omitted.

Since the embodiment described in the specification is for clearly describing the spirit of the disclosure to those skilled in the art to which the disclosure pertains, the disclosure is not limited by the embodiment described in the specification, and the scope of the disclosure should be interpreted as including modifications or variations that do not depart from the spirit of the disclosure.

The drawings bonded to the specification are intended to easily describe the disclosure. Since the shape shown in the drawings may be exaggerated and displayed as necessary to help understanding of the disclosure, the disclosure is not limited by the drawings.

In the specification, when it is determined that detailed description of a known configuration or function related to the disclosure may obscure the subject matter of the disclosure, detailed description thereof will be omitted as necessary.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

Figure 2:
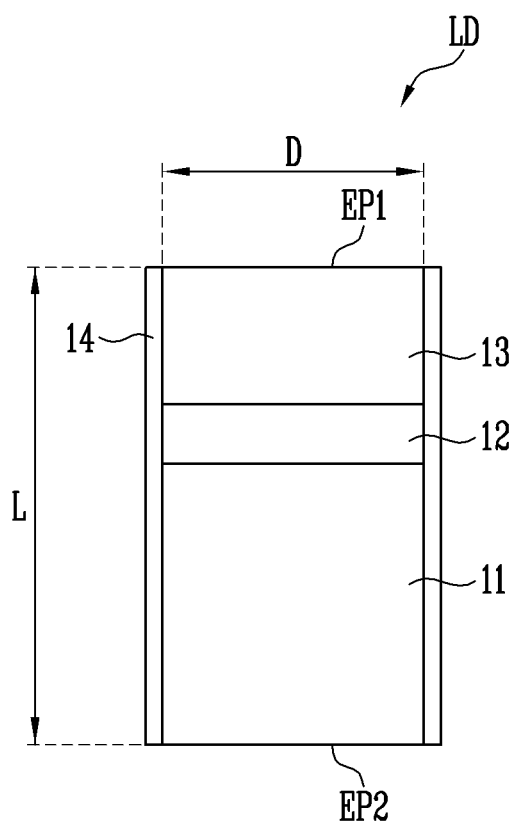
FIG. 2 is a schematic cross-sectional view illustrating the light emitting element of FIG. 1 according to an embodiment of the disclosure.

FIG. 1 is a perspective view schematically illustrating a light emitting element according to an embodiment of the disclosure, and FIG. 2 is a schematic cross-sectional view illustrating the light emitting element of FIG. 1 according to an embodiment of the disclosure.

Referring to FIGS. 1 and 2, the light emitting element LD may include a first semiconductor layer 11, a second semiconductor layer 13, and an active layer 12 interposed between the first semiconductor layer 11 and the second semiconductor layer 13. For example, the light emitting element LD may be implemented as a light emitting stack (or a stack pattern) in which the first semiconductor layer 11, the active layer 12, and the second semiconductor layer 13 are sequentially stacked.

The light emitting element LD may be provided in a shape extending in one direction. In case that the extension direction of the light emitting element LD is referred to as a length direction, the light emitting element LD may include a first end EP1 and a second end EP2 along the length direction. One of the first semiconductor layer 11 and the second semiconductor layer 13 may be disposed at the first end EP1 of the light emitting element LD, and another one of the first semiconductor layer 11 and the second semiconductor layer 13 may be disposed at the second end EP2 of the light emitting element LD.

The light emitting element LD may be provided in various shapes. For example, as shown in FIG. 1, the light emitting element LD may have a rod-like shape, a bar-like shape, or a column shape that is long in the length direction (or having an aspect ratio greater than 1). In an embodiment, the light emitting element LD may have a rod-like shape, a bar-like shape, or a column shape that is short in the length direction (or having an aspect ratio of less than 1). In an embodiment, the light emitting element LD may have a rod-like shape, a bar-like shape, or a column shape having an aspect ratio of 1.

The light emitting element LD may include, for example, a light emitting diode (LED) manufactured to be extremely small to have a diameter D and/or a length L of about a nano scale (or nano meter) to a micro scale (or micro meter).

In case that the light emitting element LD is long in the length direction (for example, the aspect ratio is greater than 1), a diameter D of the light emitting element LD may be in a range of about 0.5 μm to about 6 μm, and a length L of the light emitting element LD may be in a range of about 1 μm to about 10 μm. However, the diameter D and the length L of the light emitting element LD are not limited thereto. A size of the light emitting element LD may be changed to satisfy a requirement condition (or a design condition) of a lighting device or a self-emission display device to which the light emitting element LD is applied.

The first semiconductor layer 11 may include, for example, at least one n-type semiconductor layer. The first semiconductor layer 11 may include an upper surface contacting the active layer 12 along the length direction of the light emitting element LD and a lower surface exposed to the outside. The lower surface of the first semiconductor layer 11 may be an end (or a lower end) of the light emitting element LD.

The active layer 12 may be disposed on the first semiconductor layer 11 and may be formed in a single or multiple quantum well structure. However, a structure of the active layer 12 is not limited to the above-described embodiment.

The active layer 12 may emit light of a wavelength in a range of about 400 nm to about 900 nm, and may have a double hetero structure. The active layer 12 may include a first surface contacting the first semiconductor layer 11 and a second surface contacting the second semiconductor layer 13.

In an embodiment, a color (or an output light color) of the light emitting element LD may be determined according to the wavelength of the light emitted from the active layer 12. The color of the light emitting element LD may determine a color of a corresponding pixel. For example, the light emitting element LD may emit red light, green light, or blue light.

In case that an electric field of a reference voltage or more is applied to both ends of the light emitting element LD, the light emitting element LD may emit light as an electron-hole pair is combined in the active layer 12.

The second semiconductor layer 13 may be disposed on the second surface of the active layer 12 and may include a semiconductor layer of a type different from that of the first semiconductor layer 11.

The second semiconductor layer 13 may include a lower surface contacting the second surface of the active layer 12 along the length direction of the light emitting element LD and an upper surface exposed to the outside. The upper surface of the second semiconductor layer 13 may be another end (or an upper end) of the light emitting element LD.

In an embodiment, the first semiconductor layer 11 and the second semiconductor layer 13 may have different thicknesses in the length direction of the light emitting element LD.

Although the first semiconductor layer 11 and the second semiconductor layer 13 are shown as being configured of one layer in FIG. 1, the disclosure is not limited thereto. In an embodiment, according to the material of the active layer 12, each of the first semiconductor layer 11 and the second semiconductor layer 13 may further include at least one or more layers, for example, a clad layer and/or a tensile strain barrier reducing (TSBR) layer. The TSBR layer may be a strain relief layer disposed between semiconductor layers having different lattice structures and serving as a buffer for reducing a lattice constant difference. The TSBR layer may be configured of a p-type semiconductor layer such as p-GaInP, p-AlInP, and p-AlGaInP, but is not limited thereto.

In an embodiment, the light emitting element LD may further include an insulating layer 14 (or an insulating film) to cover the first semiconductor layer 11, the active layer 12, and the second semiconductor layer 13. However, the disclosure is not limited thereto, and according to an embodiment, the insulating layer 14 may be provided so as to cover only a portion of the first semiconductor layer 11, the active layer 12, and the second semiconductor layer 13.

The insulating layer 14 may prevent an electrical short that may occur in case that the active layer 12 contacts a conductive material other than the first and second semiconductor layers 11 and 13. The insulating layer 14 may minimize a surface defect of the light emitting element LD to improve life and light emission efficiency of the light emitting element LD.

The insulating layer 14 may surround at least a portion an outer circumferential surface of the light emitting stack including the first semiconductor layer 11, the active layer 12, and the second semiconductor layer 13.

In FIG. 1, the insulating layer 14 entirely surrounds the outer circumferential surface of each of the first semiconductor layer 11, the active layer 12, and the second semiconductor layer 13, but the disclosure is not limited thereto.

The insulating layer 14 may include a transparent insulating material. The insulating layer 14 may be provided in a single layer, or may be provided in multiple layers such as double layers.

The above-described light emitting element LD may be used as a light emitting source (or a light source) of various display devices. The light emitting element LD may be manufactured through a surface treatment process. For example, in case that multiple light emitting elements LD are mixed in a fluid solution (or solvent) and supplied to each pixel (for example, an emission area of each pixel or an emission area of each sub-pixel), surface treatment may be performed on each of the light emitting elements LD so that the light emitting elements LD may be uniformly sprayed without being unevenly aggregated in the solution.

However, the light emitting element LD applied to the display device according to embodiments of the disclosure is not limited thereto. For example, the light emitting element may be a flip chip type of micro light emitting diode or an organic light emitting element including an organic light emitting layer.

Figure 3:
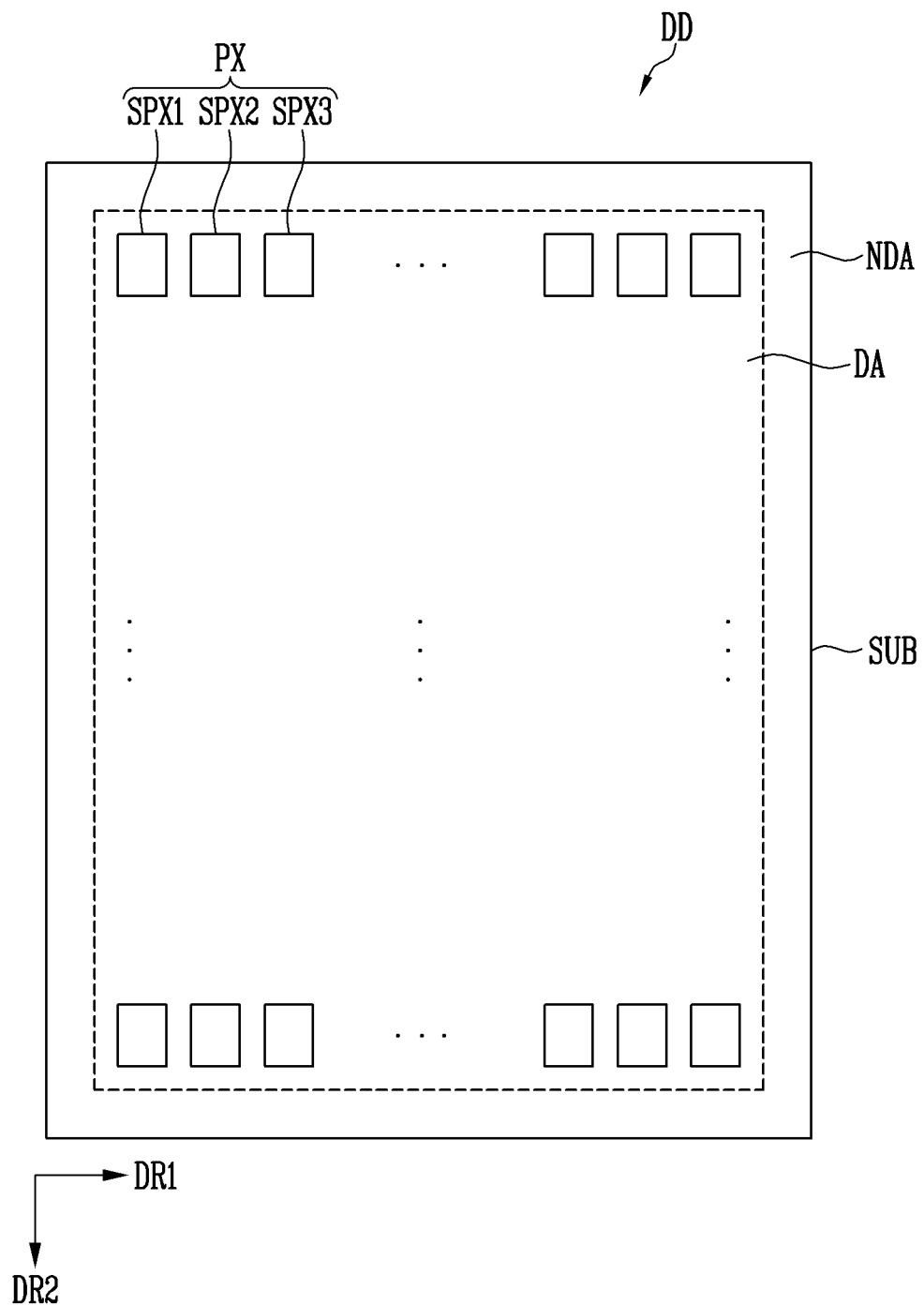
FIG. 3 is a schematic plan view illustrating a display device according to an embodiment of the disclosure.

FIG. 3 is a schematic plan view illustrating a display device according to an embodiment of the disclosure.

Referring to FIGS. 1, 2, and 3, the display device DD may include a substrate SUB, a pixel PX provided on the substrate SUB and each including at least one light emitting element LD, a driver (not illustrated) provided on the SUB and driving the pixel PX, and a line unit (not illustrated) connecting the pixel PX and the driver.

The substrate SUB may include a display area DA and a non-display area NDA.

The display area DA may be an area where the pixels PX displaying an image are provided. The non-display area NDA may be an area in which the driver for driving the pixels PX and a portion of the line unit connecting the pixels PX and the driver are provided.

The non-display area NDA may be disposed adjacent to the display area DA. The non-display area NDA may be provided on at least one side of the display area DA. For example, the non-display area NDA may surround a circumference (or an edge) of the display area DA.

The line unit may electrically connect the driver and the pixel PX. The line unit may include signal lines providing a signal to the pixel PX and connected to each of the pixels PX, for example, a fan-out line connected to a scan line, a data line, and the like.

The substrate SUB may include a transparent insulating material, and thus the substrate SUB may pass light. The substrate SUB may be a rigid substrate or a flexible substrate.

The pixels PX may be arranged in a first direction DR1 and a second direction DR2. The pixel PX may include a first sub-pixel SPX1, a second sub-pixel SPX2, and a third sub-pixel SPX3. In an embodiment, each of the first sub-pixel SPX1, the second sub-pixel SPX2, and the third sub-pixel SPX3 may emit light of one of red, green, and blue. However, the disclosure is not limited thereto, and each of the first sub-pixel SPX1, the second sub-pixel SPX2, and the third sub-pixel SPX3 may emit light of a color other than red, green, and blue.

Each of the first sub-pixel SPX1, the second sub-pixel SPX2, and the third sub-pixel SPX3 may include at least one light emitting element LD driven by corresponding scan signal and data signal. The light emitting element LD may have a size as small as a nano scale (or nano meter) to a micro scale (or micro meter) and may be connected in parallel with adjacently disposed light emitting elements, but the disclosure is not limited thereto. The light emitting element LD may configure a light source of each of the first sub-pixel SPX1, the second sub-pixel SPX2, and the third sub-pixel SPX3.

Figure 4:
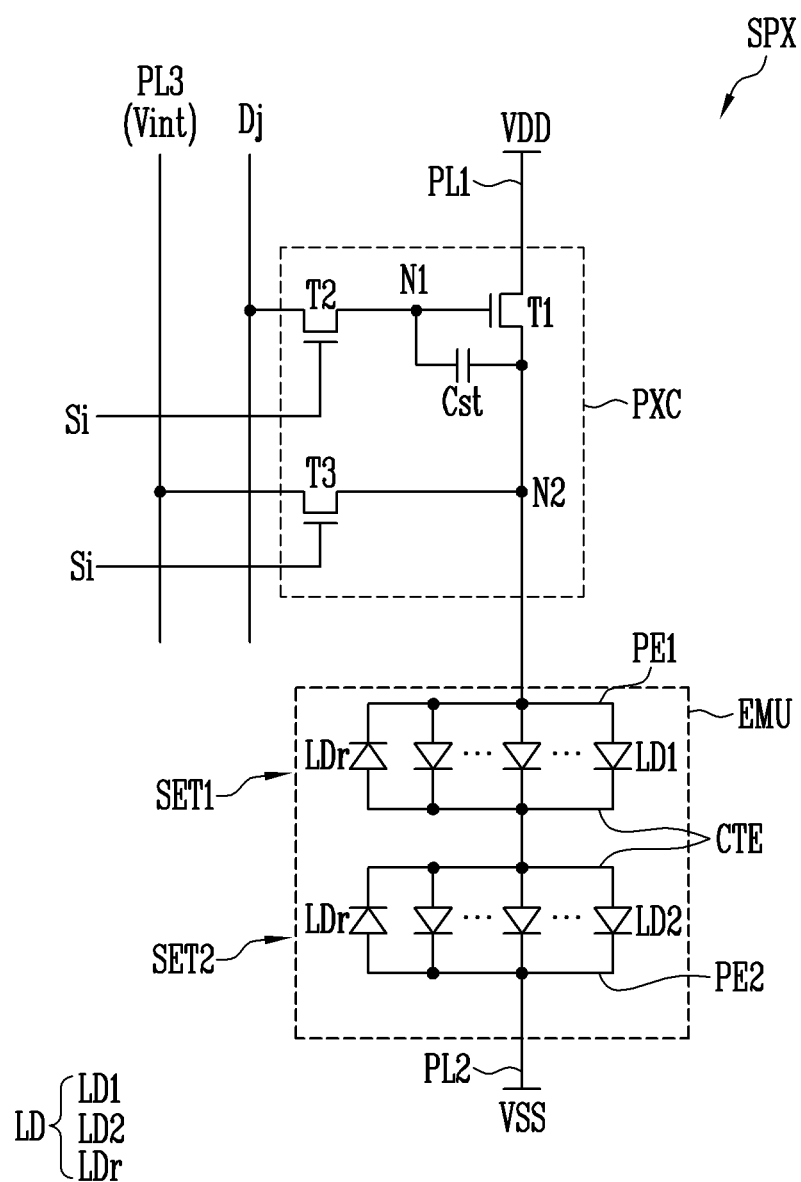
FIG. 4 is a schematic diagram of an equivalent circuit of a sub-pixel included in the display device of FIG. 3 according to an embodiment of the disclosure.

FIG. 4 is a schematic diagram illustrating a sub-pixel included in the display device of FIG. 3 according to an embodiment of the disclosure.

In the following embodiment, the first sub-pixel SPX1, the second sub-pixel SPX2, and the third sub-pixel SPX3 may be collectively referred to as a sub-pixel SPX.

Referring to FIGS. 1, 2, 3, and 4, the sub-pixel SPX may include a pixel circuit PXC and a light emitting unit EMU.

According to an embodiment, the light emitting unit EMU may include multiple light emitting elements LD connected between a first power line PL1 which is connected to first power VDD and to which a voltage of the first power VDD is applied and a second power line PL2 which is connected to second power VSS and to which a voltage of the second power VSS is applied. For example, the light emitting unit EMU may have a series/parallel mixed structure of the light emitting elements LD.

In an embodiment, the light emitting unit EMU may include a first parallel stage SET1 and a second parallel stage SET2 connected in series between the first power VDD and the second power VSS. The first power VDD and the second power VSS may have different potentials. For example, the first power VDD may be set as high potential power, and the second power VSS may be set as low potential power. A potential difference between the first power VDD and the second power VSS may be set as a threshold voltage or more of the light emitting elements LD. A voltage of the first power VDD may be provided through the first power line PL1, and a voltage of the second power VSS may be provided through the second power line PL2.

The first parallel stage SET1 may include first light emitting elements LD1 connected between a first pixel electrode PE1 and a connection electrode CTE. The first parallel stage SET1 may include a reverse light emitting element LDr connected in a direction opposite to that of other first light emitting element LD1 between the first pixel electrode PE1 and the connection electrode CTE.

The second parallel stage SET2 may include second light emitting elements LD2 connected between the connection electrode CTE and a second pixel electrode PE2. The second parallel stage SET2 may include a reverse light emitting element LDr connected in a direction opposite to that of other second light emitting element LD2 between the connection electrode CTE and the second pixel electrode PE2.

In the above-described embodiment, the first pixel electrode PE1 of the first parallel stage SET1 may be an anode of the sub-pixel SPX, and the second pixel electrode PE2 of the second parallel stage SET2 may be a cathode of the sub-pixel SPX.

As described above, the light emitting unit EMU of the sub-pixel SPX including the parallel stages SET1 and SET2 connected in a series/parallel mixed structure may readily adjust a driving current/voltage condition according to an applied product specification.

For example, a light emitting unit EMU of a series/parallel mixed structure of FIG. 4 may reduce a driving current compared to a light emitting unit of a structure in which the light emitting elements LD are connected only in parallel. The light emitting unit EMU of the series/parallel mixed structure of FIG. 4 may reduce a driving voltage applied to both ends of the light emitting unit EMU compared to a light emitting unit of a structure in which the same number of all light emitting elements LD are connected in series. Therefore, a light output efficiency of the light emitting unit EMU may be improved. The disclosure is not limited thereto, and the number of the parallel stages SET1 and SET2 is not limited thereto.

The pixel circuit PXC may be connected to a scan line Si (where i is a positive integer) and a data line Dj (where j is a positive integer) of the sub-pixel SPX. The pixel circuit PXC may be also connected to a third power line PL3. For example, in case that the sub-pixel SPX is disposed in an i-th row and a j-th column of the display area DA, the pixel circuit PXC of the sub-pixel SPX may be connected to the i-th scan line Si and the j-th data line Dj.

In an embodiment, the pixel circuit PXC may include first to third transistors T1 to T3 and a storage capacitor Cst.

The first transistor T1 may be a driving transistor for controlling a driving current applied to the light emitting unit EMU. The first transistor T1 may be connected between the first power line PL1 and the light emitting unit EMU, for example, the light emitting elements LD. For example, a first electrode of the first transistor T1 may be connected to the first power line PL1, and a second electrode of the first transistor T1 may be connected to a second node N2. A gate electrode of the first transistor T1 may be connected to a first node N1.

The first transistor T1 may control an amount of the driving current applied from the first power VDD to the light emitting unit EMU through the second node N2, according to a voltage applied to the first node N1.

The second transistor T2 may be a switching transistor that selects the sub-pixel SPX in response to a scan signal and activates the sub-pixel SPX. The second transistor T2 may be connected between the j-th data line Dj and the first node N1. A gate electrode of the second transistor T2 may be connected to the i-th scan line Si.

The second transistor T2 may be turned on by the scan signal supplied to the i-th scan line Si, and may transmit a data signal to the gate electrode of the first transistor T1.

The third transistor T3 may be connected between the third power line PL3 and the second electrode of the first transistor T1 (for example, the second node N2). A gate electrode of the third transistor T3 may be connected to the i-th scan line Si. For example, the gate electrode of the second transistor T2 and a gate electrode of the third transistor T3 may be commonly connected to the i-th scan line Si.

The third power line PL3 may provide a voltage of third power Vint (for example, initialization power). For example, the third power line PL3 may be commonly connected to all sub-pixels SPX. A voltage of the third power Vint may be different from the voltage of the first power VDD and the voltage of the second power VSS.

In case that the third transistor T3 is turned on, the voltage of the third power Vint may be applied to the second node N2. In case that the data signal is supplied to the sub-pixel SPX, the voltage of the third power Vint may be supplied to the second node N2, and thus a voltage corresponding to a difference between the data signal and the third power Vint may be stored in the storage capacitor Cst. Therefore, stable driving of the sub-pixel SPX may be possible.

As described above, the second transistor T2 and the third transistor T3 may share a scan line (for example, the i-th scan line Si), and all sub-pixels may share the third power line PL3. Therefore, a pixel circuit layout may be simplified, and high resolution may be implemented.

The storage capacitor Cst may be connected between the first node N1 and the second node N2. The storage capacitor Cst may charge a data voltage corresponding to the data signal supplied to the first node N1 during one frame period. Accordingly, the storage capacitor Cst may store a voltage corresponding to a voltage difference between a voltage of the gate electrode of the first transistor T1 and a voltage of the second node N2.

In FIG. 4, an embodiment in which all of the first, second, and third transistors T1, T2, and T3 included in the pixel circuit PXC are N-type transistors is illustrated, but the disclosure is not limited thereto. For example, at least one of the above-described first, second, and third transistors T1, T2, and T3 may be changed to a P-type transistor. A structure of the pixel circuit PXC may be also variously modified.

Figure 5:
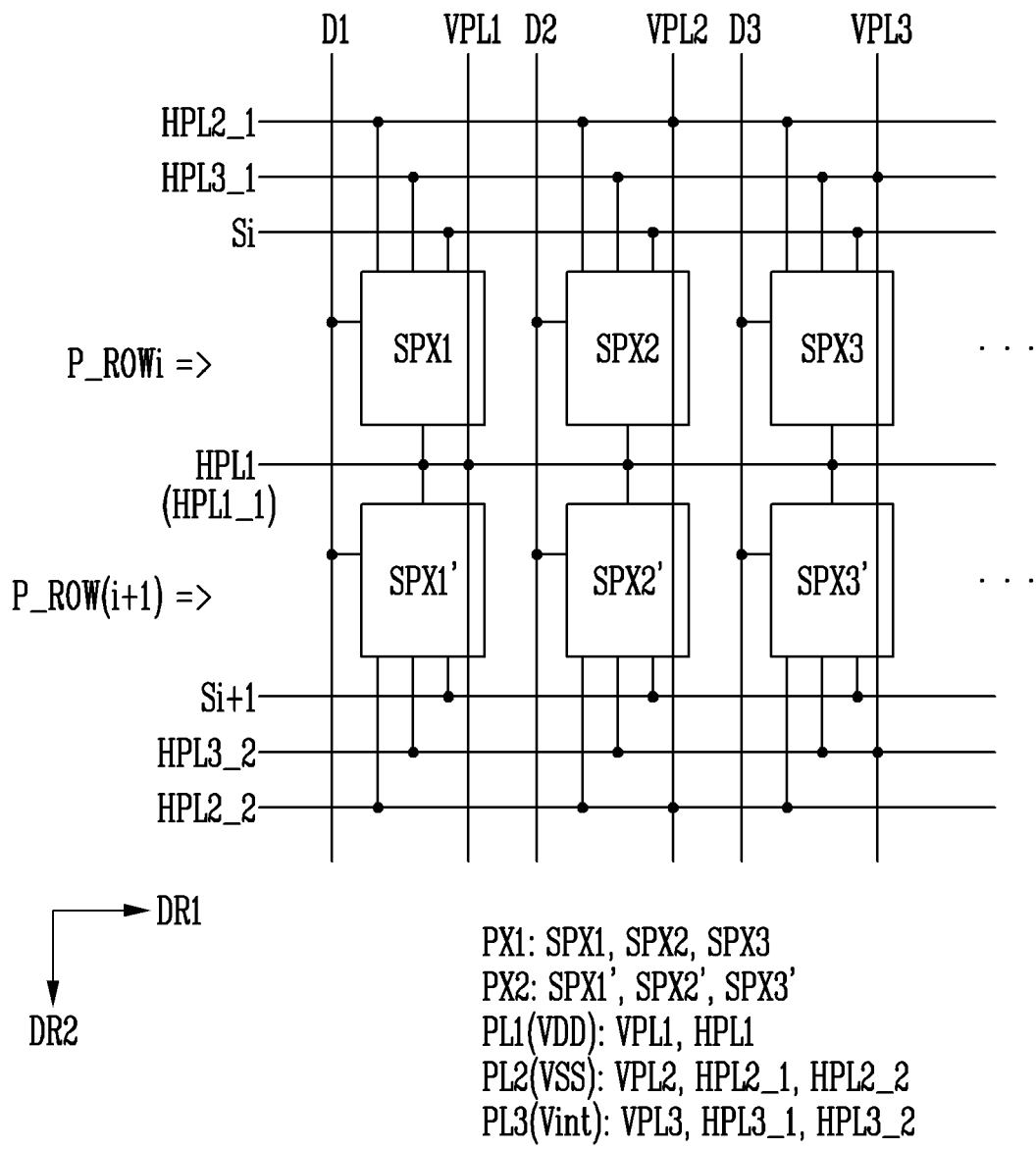
FIG. 5 is a schematic diagram illustrating signal lines connected to a pixel included in the display device of FIG. 3 according to an embodiment of the disclosure.
Figure 6:
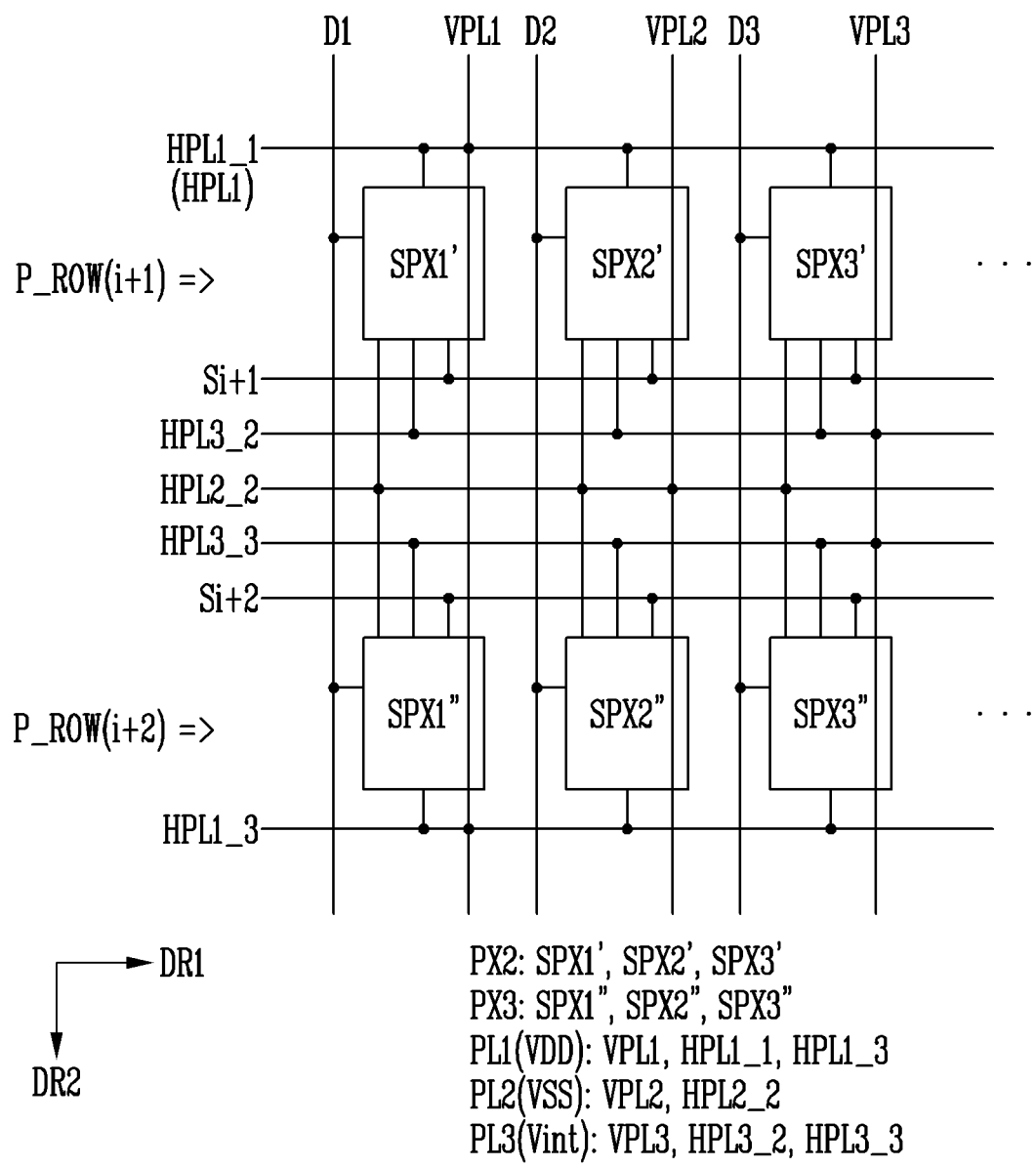
FIG. 6 is a schematic diagram illustrating signal lines connected to a pixel included in the display device of FIG. 3 according to an embodiment of the disclosure.

FIGS. 5 and 6 are schematic diagrams illustrating signal lines connected to the pixel included in the display device of FIG. 3 according to embodiments.

Referring to FIGS. 3, 4, 5, and 6, the display device DD may include pixel rows P_ROWi, P_ROW(i+1), and P_ROW(i+2) including pixels PX1, PX2, and PX3, respectively (where i is a positive integer).

A first pixel PX1 may be disposed in an i-th pixel row P_ROWi. A disposition of the first pixel PX1 in the i-th pixel row P_ROWi may be repeated in the first direction DR1. A second pixel PX2 may be disposed in an (i+1)-th pixel row P_ROW(i+1). A disposition of the second pixel PX2 in the (i+1)-th pixel row P_ROW(i+1) may be repeated in the first direction DR1. A third pixel PX3 may be disposed in an (i+2)-th pixel row P_ROW(i+2). A disposition of the third pixel PX3 in the (i+2)-th pixel row P_ROW(i+2) may be repeated in the first direction DR1.

Hereinafter, for convenience of description, the i-th pixel row P_ROWi, the (i+1)-th pixel row P_ROW(i+1), and the (i+2)-th pixel row (P_ROW(i+2)) are described as a first pixel row P_ROWi, a second pixel row P_ROW(i+1), and a third pixel row P_ROW(i+2), respectively.

The first pixel PX1 may include a first sub-pixel SPX1, a second sub-pixel SPX2, and a third sub-pixel SPX3 arranged in the first direction DR1. The second pixel PX2 may include a first sub-pixel SPX1', a second sub-pixel SPX2', and a third sub-pixel SPX3' arranged in the first direction DR1. The third pixel PX3 may include a first sub-pixel SPX1", a second sub-pixel SPX2", and a third sub-pixel SPX3" arranged in the first direction DR1.

The sub-pixels SPX1, SPX2, and SPX3 of the first pixel PX1 may be connected to the i-th scan line Si. The sub-pixels SPX1', SPX2', and SPX3' of the second pixel PX2 may be connected to an (i+1)-th scan line Si+1. The sub-pixels SPX1", SPX2", and SPX3" of the third pixel PX3 may be connected to an (i+2)-th scan line Si+2. Each of the scan lines Si, Si+1, and Si+2 may extend in the first direction DR1.

First sub-pixels SPX1, SPX1', and SPX1" may be connected to a first data line D1. Second sub-pixels SPX2, SPX2', and SPX2" may be connected to a second data line D2. Third sub-pixels SPX3, SPX3', and SPX3" may be connected to a third data line D3. Each of the data lines D1, D2, and D3 may extend in the second direction DR2.

In an embodiment, the first power line PL1 transmitting the first power VDD may include a first vertical power line VPL1 and first horizontal power lines HPL1_1 and HPL1_3. The first vertical power line VPL1 may extend in the second direction DR2 (for example, a vertical direction).

In an embodiment, the first vertical power line VPL1 may overlap the first sub-pixels SPX1, SPX1', and SPX1". The first vertical power line VPL1 may be connected to the first horizontal power lines HPL1_1 and HPL1_3 through contact holes.

A first first horizontal power line HPL1_1 may extend in the first direction DR1 between the first pixel row P_ROWi and the second pixel row P_ROW(i+1). The first pixel PX1 and the second pixel PX2 may be commonly connected to the first first horizontal power line HPL1_1. Therefore, as shown in FIG. 6, a horizontal power line transmitting the first power VDD may be not disposed between the second pixel row P_ROW(i+1) and the third pixel row P_ROW(i+2). For example, a second first horizontal power line HPL1_3 may be disposed on a lower side (for example, between the third pixel row P_ROW(i+2) and a fourth pixel row) of the third pixel row P_ROW(i+2).

For example, the horizontal power lines may be disposed on a lower side of odd-numbered pixel rows.

In an embodiment, the second power line PL2 transmitting the second power VSS may include a second vertical power line VPL2 and second horizontal power lines HPL2_1 and HPL2_2. The second vertical power line VPL2 may extend in the second direction DR2. An extension shape (for example, line width and thickness, and the like) of the first vertical power line VPL1 and the second vertical power line VPL2 may be substantially the same.

In an embodiment, the second vertical power line VPL2 may overlap the second sub-pixels SPX2, SPX2', and SPX2". The second vertical power line VPL2 may be connected to the second horizontal power lines HPL2_1 and HPL2_2 through contact holes.

A first second horizontal power line HPL2_1 may extend in the first direction DR1 on an upper side of the first pixel row P_ROWi. A second second horizontal power line HPL2_2 may be disposed between the second pixel row P_ROW(i+1) and the third pixel row P_ROW(i+2). In an embodiment, the second pixel PX2 and the third pixel PX3 may be commonly connected to the second second horizontal power line HPL2_2.

Therefore, as shown in FIG. 5, a horizontal power line transmitting the second power VSS may be not disposed between the first pixel row P_ROWi and the second pixel row P_ROW(i+1). For example, the second horizontal power lines may be disposed on a lower side of even-numbered pixel rows.

In an embodiment, the third power line PL3 transmitting the third power Vint may include a third vertical power line VPL3 and third horizontal power lines HPL3_1, HPL3_2, and HPL3_3. The third vertical power line VPL3 may extend in the second direction DR2. For example, an extension shape (for example, line width and thickness, and the like) of the first vertical power line VPL1, the second vertical power line VPL2, and the third vertical power line VPL3 may be substantially the same.

In an embodiment, the third vertical power line VPL3 may overlap the third sub-pixels SPX3, SPX3', and SPX3". The third vertical power line VPL3 may be connected to the third horizontal power lines HPL3_1, HPL3_2, and HPL3_3 through contact holes.

A first third horizontal power line HPL3_1 may extend in the first direction DR1 on the upper side of the first pixel row P_ROWi. The second second horizontal power line HPL2_2 and a second third horizontal power line HPL3_2 may be disposed between the second pixel row P_ROW(i+1) and the third pixel row P_ROW(i+2).

Therefore, as shown in FIG. 5, a horizontal power line transmitting the third power Vint may be not disposed between the first pixel row P_ROWi and the second pixel row P_ROW(i+1). For example, the third horizontal power lines may be disposed on a lower side of the even-numbered pixel rows.

In an embodiment, as shown in FIG. 5, pixel circuits and signal lines related thereto of the first pixel row P_ROWi and the second pixel row P_ROW(i+1) may be symmetrical with respect to the first first horizontal power line HPL1_1. A layout structure of pixel circuits of the sub-pixels SPX1, SPX2, and SPX3 of the first pixel PX1 may be substantially the same. A layout structure of pixel circuits of the sub-pixels SPX1', SPX2', and SPX3' of the second pixel PX2 may be substantially the same. The pixel circuits of the sub-pixels SPX1, SPX2, and SPX3 of the first pixel PX1 and the pixel circuits of the sub-pixels SPX1', SPX2', and SPX3' of the second pixel PX2 may have a shape symmetrical with respect to the first first horizontal power line HPL1_1.

In an embodiment, as shown in FIG. 6, pixel circuits and signal lines related thereto of the second pixel row P_ROW (i+1) and the third pixel row P_ROW(i+2) may be symmetrical with respect to the second second horizontal power line HPL2_2. Pixel circuits of the sub-pixels SPX1', SPX2', and SPX3' of the second pixel PX2 and pixel circuits of the sub-pixels SPX1", SPX2", and SPX3" of the third pixel PX3 may have a shape symmetrical with respect to the second second horizontal power line HPL2_2.

The second third horizontal power line HPL3_2 and the third third horizontal power line HPL3_3 may be disposed symmetrically with respect to the second second horizontal power line HPL2_2, and the (i+1)-th scan line Si+1 and the (i+2)-th scan line Si+2 may be disposed symmetrically with respect to the second second horizontal power line HPL2_2. For example, the (i+1)-th scan line Si+1, the second third horizontal power line HPL3_2, the second second horizontal power line HPL2_2, the third third horizontal power line HPL3_3, and the (i+2)-th scan line Si+2 may be arranged sequentially in the second direction DR2 between the second pixel row P_ROW(i+1) and the third pixel row P_ROW(i+2).

In FIGS. 5 and 6, the first to third vertical power lines VPL1, VPL2, and VPL3 are sequentially arranged in the first direction DR1, but an arrangement order of the vertical power lines is not limited thereto.

As described above, only one of each of the vertical power lines VPL1, VPL2, and VPL3 respectively transmitting the first power VDD, the second power VSS, and the third power Vint may be disposed in the pixels PX1, PX2, and PX3. Therefore, a backplane design of the display device DD may be simplified. Since a backplane planar shape is designed to be symmetrical with respect to the horizontal power lines (for example, HPL1_1 and HPL2_2), an integration degree of metal lines may be reduced. Therefore, a yield and resolution of the display device DD may be increased.

Figure 7:
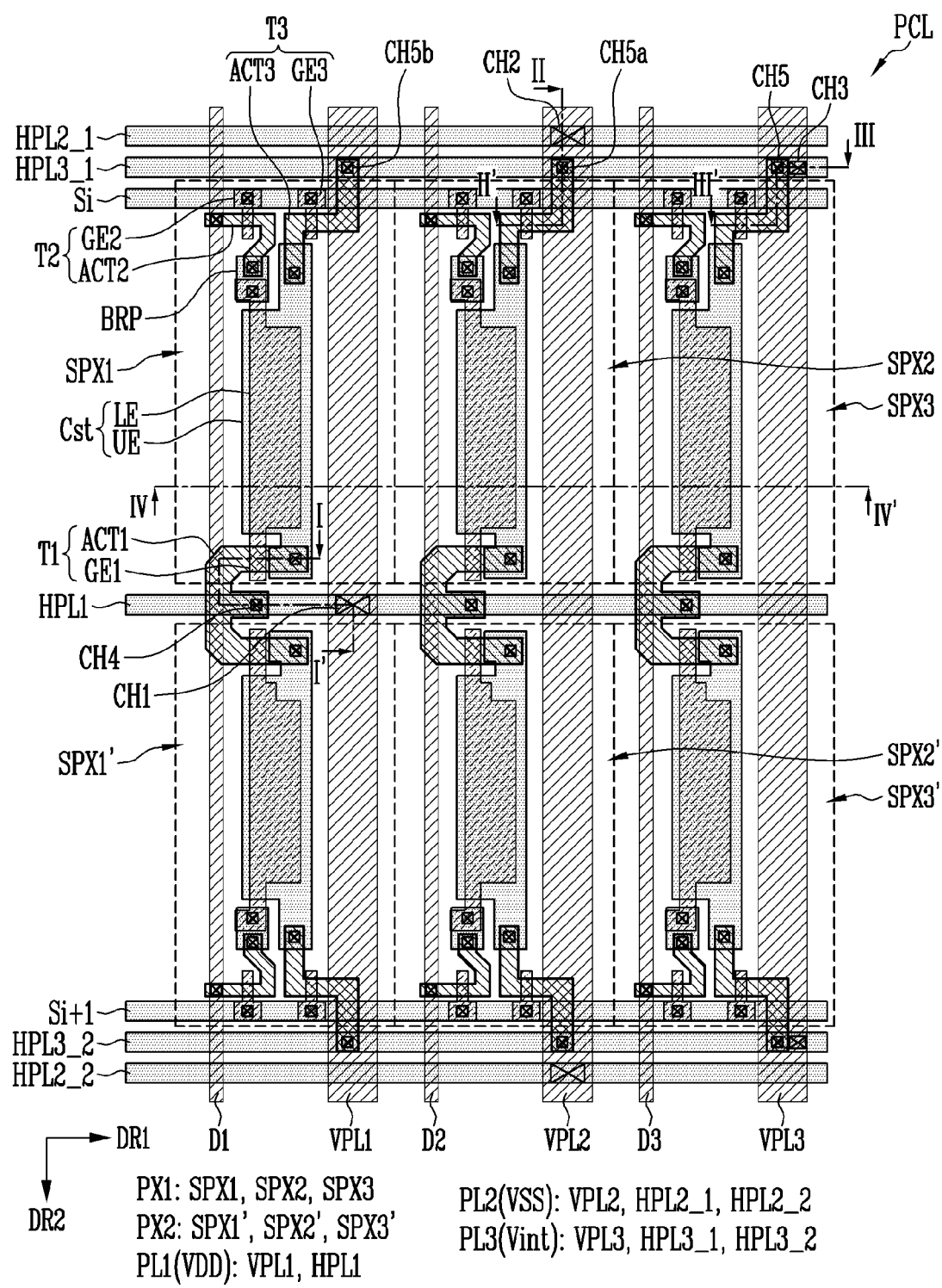
FIG. 7 is a schematic layout diagram illustrating a pixel circuit layer of a display area of the display device of FIG. 3 according to an embodiment of the disclosure.

FIG. 7 is a schematic layout diagram illustrating a pixel circuit layer of a display area of the display device of FIG. 3 according to an embodiment of the disclosure.

In FIG. 7, a layout is shown based on the pixel circuit PXC (for example, a pixel circuit layer PCL or a backplane structure) of the first pixel PX1 and the second pixel PX2 of FIG. 5.

Referring to FIGS. 3, 4, 5, 6, and 7, the first pixel PX1 may include the first sub-pixel SPX1, the second sub-pixel SPX2, and the third sub-pixel SPX3, and the second pixel PX2 may include the first sub-pixel SPX1', the second sub-pixel SPX2', and the third sub-pixel SPX3'.

Since the sub-pixels SPX1, SPX2, SPX3, SPX1', SXP2', and SPX3' have configurations identical or similar to each other, a common configuration is described based on the first sub-pixel SPX1, and an overlapping description is omitted. In FIG. 7, an area defining the sub-pixels SPX1, SPX2, SPX3, SPX1', SXP2', and SPX3' is arbitrarily partitioned based on transistors, data line, and vertical power line, but this is for convenience of description, and the sub-pixels are not required to be divided as shown in FIG. 7.

Scan lines Si, Si+1, and Si+2 may extend in the first direction DR1, and data lines D1, D2, and D3 may extend in the second direction DR2.

The first vertical power line VPL1, the second vertical power line VPL2, and the third vertical power line VPL3 may extend in the second direction DR2. Distances in the first direction DR1 between adjacent vertical power lines may be substantially the same. For example, a distance between the first vertical power line VPL1 and the second vertical power line VPL2 and a distance between the second vertical power line VPL2 and the third vertical power line VPL3 may be substantially the same.

Planar shapes of the first vertical power line VPL1, the second vertical power line VPL2, and the third vertical power line VPL3 may be substantially the same.

The first vertical power line VPL1 may overlap the first pixels SPX1 and SPX1' and extend in the second direction DR2. The second vertical power line VPL2 may overlap the second pixels SPX2 and SPX2' and extend in the second direction DR2. The third vertical power line VPL3 may overlap the third pixels SPX3 and SPX3' and extend in the second direction DR2.

The first vertical power line VPL1, the second vertical power line VPL2, the third vertical power line VPL3, and the data lines D1, D2, and D3 may include a same material and may be disposed on a same layer through a same process. For example, the first vertical power line VPL1, the second vertical power line VPL2, the third vertical power line VPL3, and the data lines D1, D2, and D3 may be formed in a first conductive layer.

A semiconductor layer including a first active pattern ACT1, a second active pattern ACT2, and a third active pattern ACT3 may be disposed on the first conductive layer including the first vertical power line VPL1, the second vertical power line VPL2, the third vertical power line VPL3, and the data lines D1, D2, and D3.

The first active pattern ACT1, the second active pattern ACT2, and the third active pattern ACT3 may include a same material and may be disposed on a same layer through a same process.

The first active pattern ACT1 may include a channel area, a source area, and a drain area of the first transistor T1. In an embodiment, the first sub-pixel SPX1 of the first pixel PX1 and the first sub-pixel SPX1' of the second pixel PX2 may share the first active pattern ACT1. For example, a first area (for example, a drain area or a first electrode) of the first sub-pixel SPX1 and a first area (for example, a drain area or a first electrode) of the first sub-pixel SPX1' may be integral with each other and may be connected to the first horizontal power line HPL1 through a fourth contact hole CH4.

A second area (or the source area) of the first active pattern ACT1 may be connected to an upper electrode UE of the storage capacitor Cst.

The channel area of the first active pattern ACT1 may overlap a first gate electrode GE1. The first gate electrode GE1 (for example, the gate electrode of the first transistor T1) and a lower electrode LE of the storage capacitor Cst may be integral with each other.

The second active pattern ACT2 may include a channel area, a source area, and a drain area of the second transistor T2. The drain area (or the source area) of the second active pattern ACT2 may be connected to the first data line D1 through a contact hole. The source area (or the drain area) of the second active pattern ACT2 may be connected to a bridge pattern BRP through a contact hole. The bridge pattern BRP may be connected to the lower electrode LE of the storage capacitor Cst through another contact hole.

The channel area of the second transistor T2 may overlap a second gate electrode GE2 (for example, the gate electrode of the second transistor T2).

The third active pattern ACT3 may include a channel area, a source area, and a drain area of the third transistor T3. The drain area (or the source area) of the third active pattern ACT3 may be connected to the first third horizontal power line HPL3_1 through a contact hole (for example, CH5, CH5a, or CH5b). The source area (or the drain area) of the second active pattern ACT2 may be connected to the upper electrode UE of the storage capacitor Cst through another contact hole.

The channel area of the third transistor T3 may overlap a third gate electrode GE3 (for example, the gate electrode of the third transistor T3).

The first gate electrode GE1, the second gate electrode GE2, the third gate electrode GE3, and the lower electrode LE of the storage capacitor Cst may include a same material and may be disposed on a same layer through a same process. The first gate electrode GE1, the second gate electrode GE2, the third gate electrode GE3, and the lower electrode LE of the storage capacitor Cst may be formed on the semiconductor layer. For example, the first gate electrode GE1, the second gate electrode GE2, the third gate electrode GE3, and the lower electrode LE of the storage capacitor Cst may be formed of a second conductive layer.

The first gate electrode GE1 and the lower electrode LE may be integral with each other. The first gate electrode GE1 may overlap the channel area of the first active pattern ACT1. The first gate electrode GE1 and the lower electrode LE may be connected to the second active pattern ACT2 through the bridge pattern BRP.

The second gate electrode GE2 may overlap the channel area of the second active pattern ACT2. The second gate electrode GE2 may be connected to the i-th scan line Si through a contact hole.

The third gate electrode GE3 may overlap the channel area of the third active pattern ACT3. The third gate electrode GE3 may be connected to the i-th scan line Si through a contact hole.

The horizontal power lines HPL1, HPL2_1, HPL3_1, HPL2_2, and HPL3_2, the scan lines Si and Si+1, the upper electrode UE of the storage capacitor Cst, and the bridge pattern BRP may include a same material and may be disposed on a same layer through a same process. The horizontal power lines HPL1, HPL2_1, HPL3_1, HPL2_2, and HPL3_2, the scan lines Si and Si+1, the upper electrode UE of the storage capacitor Cst, and the bridge pattern BRP may be formed on the second conductive layer as a third conductive layer.

The upper electrode UE of the storage capacitor Cst may overlap the lower electrode LE. The upper electrode UE may be connected to the first active pattern ACT1 and the third active pattern ACT3 through contact holes.

The bridge pattern BRP may be connected to the second active pattern ACT2 and the lower electrode LE through contact holes.

The horizontal power lines HPL1, HPL2_1, HPL3_1, HPL2_2, and HPL3_2 and the scan lines Si and Si+1 may extend in the first direction DR1.

In an embodiment, the first horizontal power line HPL1 may be disposed between the first pixel PX1 and the second pixel PX2. The first horizontal power line HPL1 may be connected to the first vertical power line VPL1 through a first contact hole CH1. Therefore, the first power VDD may be supplied to the first transistor T1 through the fourth contact hole CH4.

In an embodiment, pixel circuits PXC of the first pixel PX1 and pixel circuits PXC of the second pixel PX2 may be disposed to be symmetrical to each other with respect to the first horizontal power line HPL1. Therefore, the first transistors T1 of the first pixel PX1 and the first transistors T1 of the second pixel PX2 may share the first horizontal power line HPL1. Signal lines (for example, the second and third horizontal lines HPL2_1, HPL3_1, HPL2_2, HPL3_2, and HPL3_2) and the scan lines Si and Si+1 extending in a horizontal direction may be symmetrical with respect to the first horizontal power line HPL1.

The first second horizontal power line HPL2_1 may be disposed on an upper side of the first pixel PX1. The first second horizontal power line HPL2_1 may be connected to the second vertical power line VPL2 through a second contact hole CH2. The first second horizontal power line HPL2_1 may be connected to a second pixel electrode PE2 of the light emitting unit EMU disposed thereon.

The second second horizontal power line HPL2_2 may be disposed on a lower side of the second pixel PX2. The second second horizontal power line HPL2_2 may also be connected to the second vertical power line VPL2 through a contact hole.

The first third horizontal power line HPL3_1 may be disposed on an upper side of the first pixel PX1. The first third horizontal power line HPL3_1 may be connected to the third vertical power line VPL3 through a third contact hole CH3. The first third horizontal power line HPL3_1 may be connected to the third transistors T3 (for example, the third active patterns ACT3) of the first pixel PX1.

The second third horizontal power line HPL3_2 may be disposed on a lower side of the second pixel PX2. The second third horizontal power line HPL3_2 may also be connected to the third transistors T3 (for example, the third active patterns ACT3) of the second pixel PX2 through a contact hole.

The i-th scan line Si may be disposed on an upper side of the first pixel PX1. The i-th scan line Si may be connected to the second gate electrodes GE2 and the third gate electrodes GE3 of the first pixel PX through a contact hole.

The (i+1)-th scan line Si+1 may be disposed on a lower side of the second pixel PX2. The (i+1)-th scan line Si+1 may be connected to the second gate electrodes GE2 and the third gate electrodes GE3 of the second pixel P2 through a contact hole.

A pixel of the third pixel row and the first pixel PX1 may have substantially same shape. The pixel of the fourth pixel row and the second pixel PX2 may have substantially same shape.

As described above, the three vertical power lines VPL1, VPL2, and VPL3 extending in the second direction DR2 in the pixels PX1 and PX2 may supply different power VDD, VSS, and Vint to the pixels PX1 and PX2. The distance and shape between the vertical power lines VPL1, VPL2, and VPL3 may be substantially the same. Therefore, a design (for example, a planar design) of the pixel circuit layer PCL of the sub-pixels SPX1, SPX2, and SPX3 may be simplified, and as a planar layout of the pixel circuit layer PCL of the sub-pixels SPX1, SPX2, and SPX3 is unified, an upper surface step difference of the pixel circuit layer PCL of the sub-pixels SPX1, SPX2, and SPX3 may be substantially the same. Since the pixels PX1 and PX2 are symmetrically designed based on a horizontal power line, an integration degree of a conductive pattern may be reduced and high resolution may be implemented.

Figure 8:
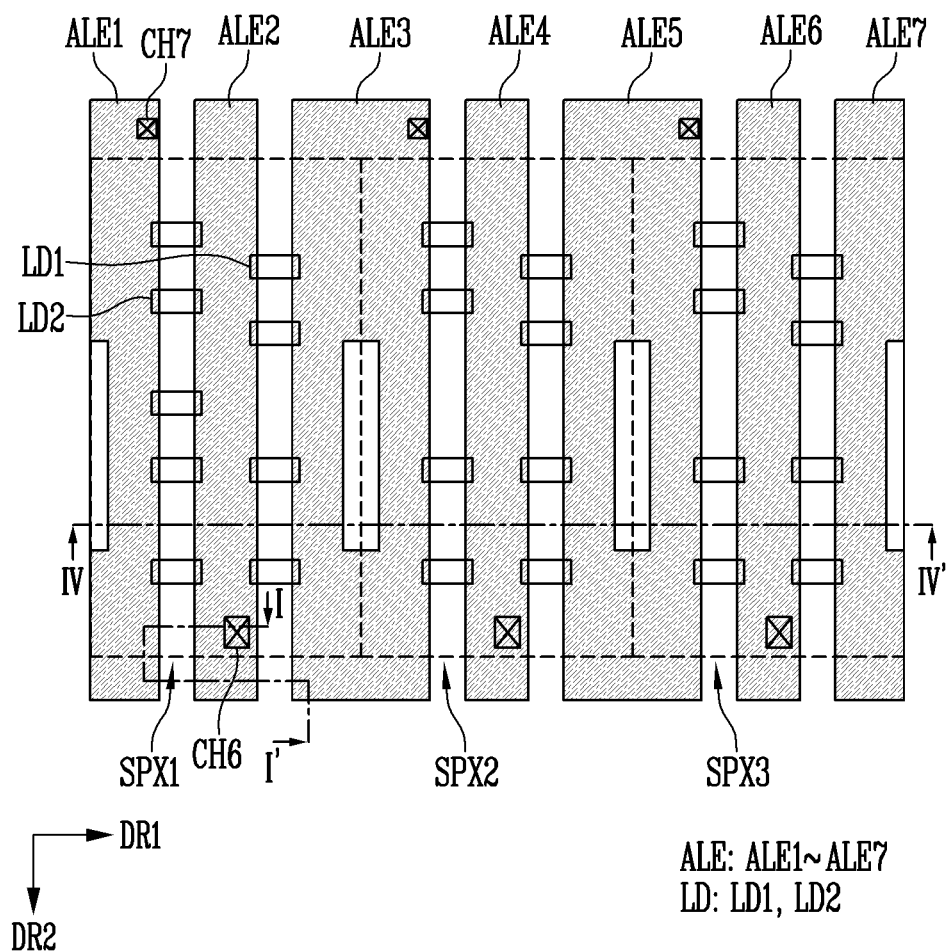
FIG. 8 is a schematic plan view illustrating alignment electrodes and light emitting elements included in the display device of FIG. 3 according to an embodiment of the disclosure.
Figure 9:
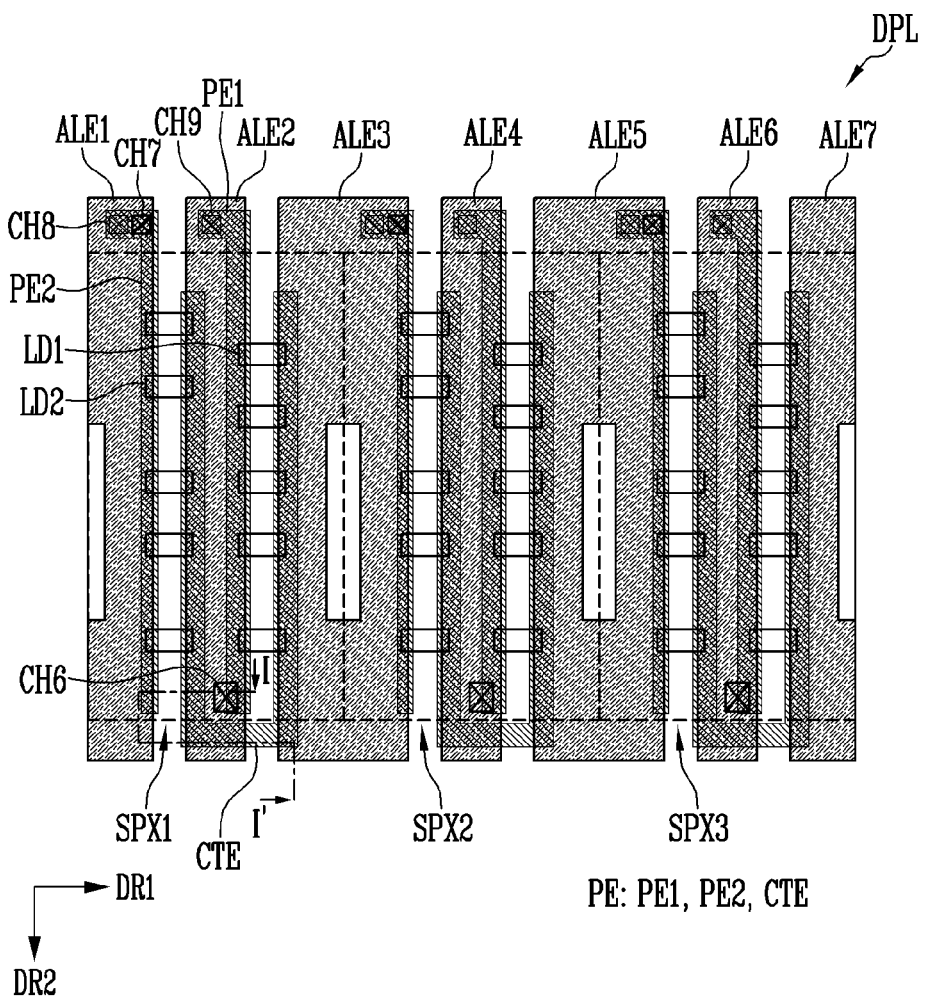
FIG. 9 is a schematic plan view illustrating a display element layer included in the display device of FIG. 3 according to an embodiment of the disclosure.

FIG. 8 is a schematic plan view illustrating alignment electrodes and light emitting elements included in the display device of FIG. 3 according to an embodiment of the disclosure, and FIG. 9 is a schematic plan view illustrating a display element layer included in the display device of FIG. 3 according to an embodiment of the disclosure.

Referring to FIGS. 4, 5, 7, 8, and 9, the display element layer DPL may include alignment electrodes ALE, a light emitting element LD, and pixel electrodes PE.

In FIGS. 8 and 9, a planar shape of the alignment electrodes ALE, the light emitting element LD, and the pixel electrodes PE is simplified and some configurations of the display element layer DPL are omitted for convenience of description. In FIGS. 8 and 9, only a portion of the display element layer DPL corresponding to the first pixel PX1 is shown.

The alignment electrodes ALE may be disposed to align the light emitting elements LD during a manufacturing process. The alignment electrodes ALE may be arranged to be spaced apart from each other at the same distance in the first direction DR1. The alignment electrodes ALE may extend in the second direction DR2. In an alignment process of the light emitting element LD, different alignment signals may be applied to alignment electrodes adjacent to each other. For example, a first alignment signal may be supplied to a first alignment electrode ALE1 and a second alignment signal may be supplied to a second alignment electrode ALE2. Each of the first alignment signal and the second alignment signal may be an AC signal or a ground signal. In case that an electric field is formed between (or on) the first alignment electrode ALE1 and the second alignment electrode ALE2, the light emitting elements LD may be aligned on (or between) the first alignment electrode ALE1 and the second alignment electrode ALE2 in response to the electric field. For example, the light emitting elements LD may be moved (or rotated) by force (for example, dielectrophoresis (DEP) force) according to the electric field to be aligned (or disposed) on the alignment electrodes.

The first alignment electrode ALE1, the second alignment electrode ALE2, and a third alignment electrode ALE3 may be included in the first sub-pixel SPX1. According to an embodiment, first light emitting elements LD1 may be aligned between the second alignment electrode ALE2 and the third alignment electrode ALE3, and second light emitting elements LD2 may be aligned between the first alignment electrode ALE1 and the second alignment electrode ALE2.

The third alignment electrode ALE3 may be formed over both of the first sub-pixel SPX1 and the second sub-pixel SPX2. Therefore, the third alignment electrode ALE3, a fourth alignment electrode ALE4, and a fifth alignment electrode ALE5 may be included in the second sub-pixel SPX2. The fifth alignment electrode ALE5 may be formed over both of the second sub-pixel SPX2 and the third sub-pixel SPX3. Therefore, the fifth alignment electrode ALE5, a sixth alignment electrode ALE6, and a seventh alignment electrode ALE7 may be included in the third sub-pixel SPX3. In an embodiment, the first, third, fifth, and seventh alignment electrodes ALE1, ALE3, ALE5, and ALE7 may include an opening of a same shape. However, the disclosure is not limited thereto, and a shape of the alignment electrodes ALE is not limited thereto.

In the alignment process of the light emitting elements LD, a stack step difference of the pixel circuit layer PCL may occur due to presence or absence of a conductive layer, a contact hole, and the like under the alignment electrodes ALE. For example, in case that a stack step difference of the pixel circuit layer PCL under the first alignment electrode ALE1 and the second alignment electrode ALE2 and a stack step difference of the pixel circuit layer PCL under the third alignment electrode ALE3 and the fourth alignment electrode ALE4 are different, an actual distance between the first alignment electrode ALE1 and the second alignment electrode ALE2 may be different from an actual distance between the third alignment electrode ALE3 and the fourth alignment electrode ALE4. Accordingly, an electric field between the first alignment electrode ALE1 and the second alignment electrode ALE2 and an electric field between the third alignment electrode ALE3 and the fourth alignment electrode ALE4 may be formed differently. An alignment form of the light emitting elements LD in the first sub-pixel SPX1 and the second sub-pixel SPX2 may be different (for example, eccentricity, deflection and the like of the light emitting elements LD may be caused), and an alignment deviation may occur, due to the difference of the electric field. A deviation and a defect of an alignment degree of the light emitting elements LD between the sub-pixels SPX1, SPX2, and SPX3 may reduce display quality.

In order to minimize the alignment deviation of the light emitting elements between the sub-pixels, as shown in FIG. 7, the display device DD according to embodiments of the disclosure may include a structure of the pixel circuit layer PCL having a unified planar layout of the pixel circuit layer PCL of the sub-pixels SPX1, SPX2, and SPX3 included in a same pixel while simplifying a line structure of the pixel circuit layer PCL.

Since a lower configuration of the alignment electrodes ALE is unified in all of the sub-pixels SPX1, SPX2, and SPX3, a deviation between the sub-pixels SPX1, SPX2, and SPX3 of electric fields formed by the alignment electrodes ALE may be minimized or reduced.

Figure 11:
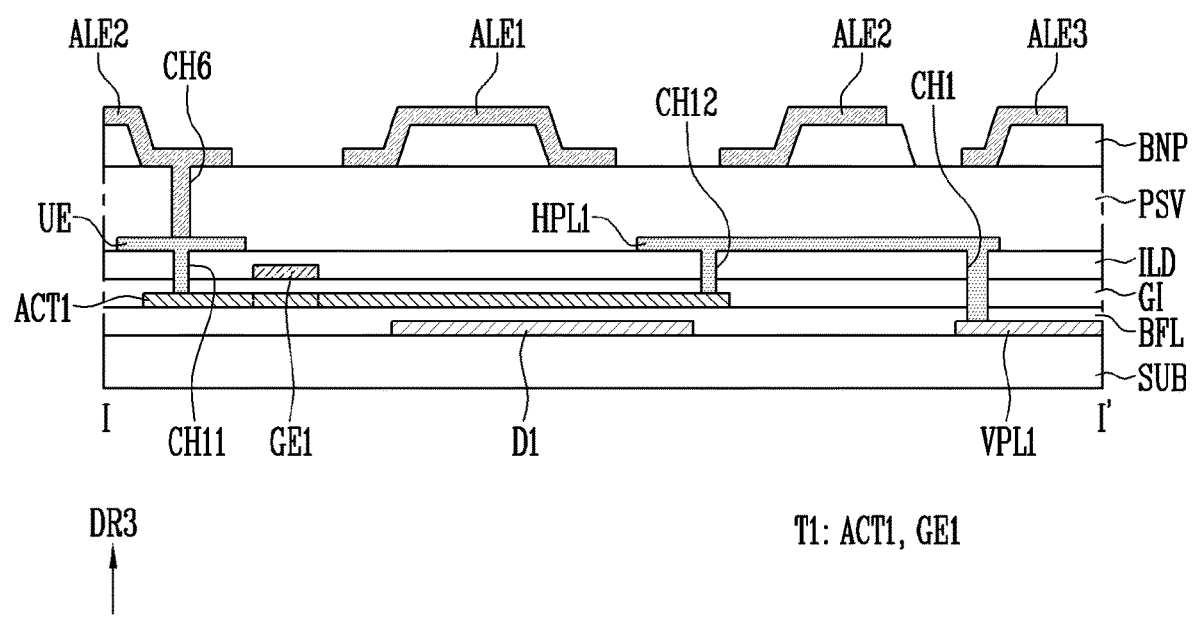
FIG. 11 is a schematic cross-sectional view illustrating a display device taken along line I-I' of FIGS. 7 and 8 according to an embodiment of the disclosure.

In an embodiment, the second alignment electrode ALE2 may be connected to the upper electrode UE of the storage capacitor Cst through a sixth contact hole CH6 (FIG. 11). Therefore, the second alignment electrode ALE2 may be electrically connected to the first electrode of the first transistor T1.

The first alignment electrode ALE1 may be connected to the first second horizontal power line HPL2_1 through a seventh contact hole CH7. Accordingly, the voltage of the second power VSS may be supplied to the first alignment electrode ALE1.

As shown in FIG. 9, the pixel electrodes PE may be disposed on the alignment electrodes ALE and the light emitting elements LD. The pixel electrodes PE may include a first pixel electrode PE1, a second pixel electrode PE2, and a connection electrode CTE.

Since a disposition of the pixel electrodes PE in the first, second, and third sub-pixels SPX1, SPX2 and SPX3 is substantially the same, the disclosure is described based on the pixel electrodes PE of the first sub-pixel SPX1.

The first pixel electrode PE1 may overlap a portion of the second alignment electrode ALE2. The first pixel electrode PE1 may be connected to a first end EP1 of each of the first light emitting elements LD1.

In an embodiment, the first pixel electrode PE1 may be connected to the second alignment electrode ALE2 through a ninth contact hole CH9. Therefore, the first pixel electrode PE1 may be connected to the first transistor T1 and the upper electrode UE of the storage capacitor Cst through the ninth contact hole CH9, the second alignment electrode ALE2, and the sixth contact hole CH6. The first pixel electrode PE1 may be connected to the upper electrode UE. However, the disclosure is not limited thereto, and the first pixel electrode PE1 may be connected to the first transistor T1 and the upper electrode UE of the storage capacitor Cst through a contact hole without passing through the second alignment electrode ALE2.

The connection electrode CTE may overlap a portion of the second alignment electrode ALE2 and the third alignment electrode ALE3. For example, the connection electrode CTE may have a shape surrounding a portion of the first pixel electrode PE1.

In an embodiment, the connection electrode CTE may be electrically connected to a second end EP2 of the first light emitting element LD1 and may be electrically connected to a first end EP1 of the second light emitting element LD2.

The second pixel electrode PE2 may overlap the first alignment electrode ALE1. The second pixel electrode PE2 may be electrically connected to a second end EP2 of the second light emitting element LD2.

In an embodiment, the second pixel electrode PE2 may be connected to the first alignment electrode ALE1 through an eighth contact hole CH8. Since the first alignment electrode ALE1 is connected to the first second horizontal power line HPL2_1 through the seventh contact hole CH7, the voltage of the second power VSS may be supplied to the second pixel electrode PE2. However, the disclosure is not limited thereto, and the second pixel electrode PE2 may be directly connected to the first second horizontal power line HPL2_1 through a contact hole without a connection to the first alignment electrode ALE1.

However, a disposition of the alignment electrodes ALE and the pixel electrodes PE of FIGS. 8 and 9 is not limited thereto.

Figure 10:
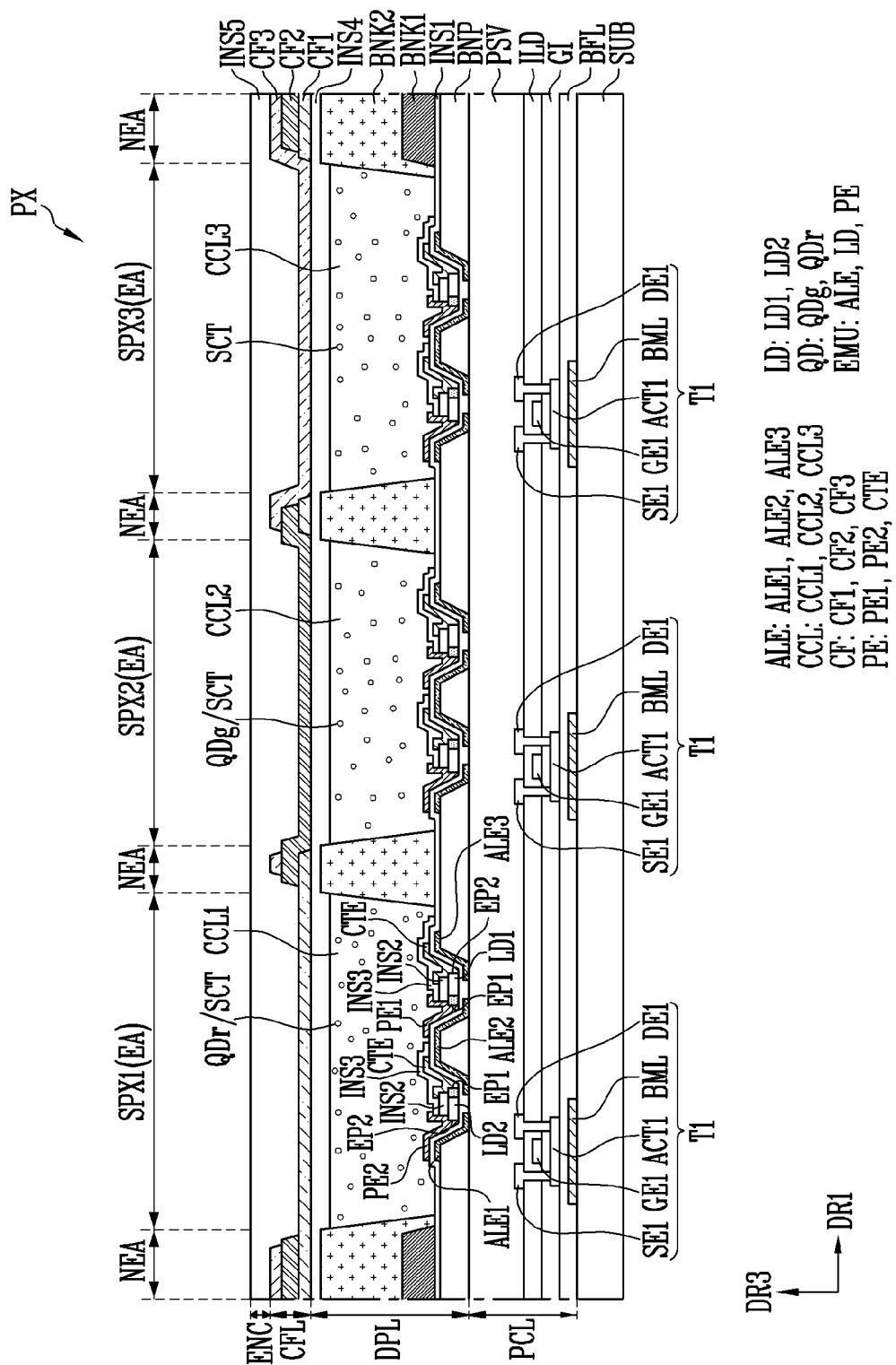
FIG. 10 is a schematic cross-sectional view illustrating the pixel included in the display device of FIG. 3 according to an embodiment of the disclosure.

FIG. 10 is a schematic cross-sectional view illustrating the pixel included in the display device of FIG. 3 according to an embodiment of the disclosure.

Referring to FIGS. 3, 7, 8, 9, and 10, the pixel PX may include the substrate SUB, the pixel circuit layer PCL, the display element layer DPL, a color filter layer CFL, and an encapsulation layer ENC.

The pixel PX may include the first sub-pixel SPX1, the second sub-pixel SPX2, and the third sub-pixel SPX3 arranged in the first direction DR1. Each of the first sub-pixel SPX1, the second sub-pixel SPX2, and the third sub-pixel SPX3 may be divided by a non-emission area NEA.

The substrate SUB may be a rigid substrate or a flexible film type substrate. The substrate SUB may be a single layer or multiple layers of substrate or film.

The pixel circuit layer PCL may include the pixel circuit PXC of each of the first, second, and third sub-pixels SPX1, SPX2, and SPX3. In FIG. 10, only first transistor T1 is shown for convenience of description. The drain electrode DE1 of the first transistor T1 may be connected to the first horizontal power line HPL1 through the first contact hole (CH1 of FIG. 7). The source electrode SE1 of the first transistor T1 may be connected to the second alignment electrode ALE2 through the sixth contact hole CH6 and may be connected to the first pixel electrode PE1 through the second alignment electrode ALE2.

The pixel circuit layer PCL may include multiple insulating layers. For example, the pixel circuit layer PCL may include a buffer layer BFL, a gate insulating layer GI, an interlayer insulating layer ILD, and/or a passivation layer PSV sequentially disposed on a surface of the substrate SUB.

The pixel circuit layer PCL may be disposed on the substrate SUB and may include a first conductive layer including a lower metal layer (or a bottom metal layer) BML. For example, the first conductive layer, which is the lower metal layer BML, may be disposed between the substrate SUB and the buffer layer BFL, and may include the data lines D1, D2, and D3 and the vertical power lines VPL1, VPL2, and VPL3 shown in FIG. 7. In FIG. 10, the lower metal layer BML overlaps the first active pattern ACT1, but the disclosure is not limited thereto.

The buffer layer BFL may be disposed on a surface of the substrate SUB including the first conductive layer. The buffer layer BFL may prevent an impurity from diffusing into each circuit element.

The semiconductor layer may be disposed on the buffer layer BFL. The semiconductor layer may include the active patterns ACT1, ACT2, and ACT3. For example, the first active pattern ACT1 may include the channel area overlapping the first gate electrode GE1 of the first transistor T1, and the source area and the drain area disposed on both sides of the channel area.

The gate insulating layer GI may be disposed on the semiconductor layer. A second conductive layer may be disposed on the gate insulating layer GI. The second conductive layer may include the gate electrodes GE1, GE2, and GE3 and the lower electrode LE of the storage capacitor Cst.

The interlayer insulating layer ILD may be disposed on the second conductive layer. A third conductive layer may be disposed on the interlayer insulating layer ILD.

The third conductive layer may include the source electrodes and the drain electrodes of the transistors T1, T2, and T3. For example, the source electrode SE1 of the first transistor T1 may be connected to the source area of the first active pattern ACT1 through a contact hole, and the drain electrode DE1 of the first transistor T1 may be connected to the drain area of the first active pattern ACT1 through a contact hole.

The third conductive layer may also include the upper electrode UE of the storage capacitor Cst, the scan lines Si and Si+1, and the horizontal power lines HPL1, HPL2_1, HPL2_2, HPL3_1, and HPL3_2.

Each of the conductive patterns, electrodes and/or lines configuring the first to third conductive layers may have conductivity by including at least one conductive material, and a material thereof is not particularly limited. For example, each of the conductive patterns, electrodes and/or lines configuring the first to third conductive layers may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), and may include various types of other conductive materials.

The passivation layer PSV may be disposed on the third conductive layer. Each of the buffer layer BFL, the gate insulating layer GI, the interlayer insulating layer ILD, and the passivation layer PSV may be configured as a single layer or multiple layers, and may include at least one inorganic insulating material and/or organic insulating material. For example, each of the buffer layer BFL, the gate insulating layer GI, the interlayer insulating layer ILD, and the passivation layer PSV may include various types of organic/inorganic insulating materials such as silicon nitride ($SiN_x$), silicon oxide ($SiO_x$), silicon oxynitride ($SiO_xN_y$), and the like. In an embodiment, the passivation layer PSV may include an organic insulating layer and may planarize a surface of the pixel circuit layer PCL.

The display element layer DPL may be disposed on the passivation layer PSV.

The display element layer DPL may include the light emitting units EMU of the sub-pixels SPX1, SPX2, and SPX3. For example, the display element layer DPL may include the alignment electrodes ALE, the light emitting elements LD, and the pixel electrodes PE included in each light emitting unit EMU.

The display element layer DPL may include a bank pattern BNP, a first insulating layer INS1, a first bank BNK1, a second insulating layer INS2, a third insulating layer INS3, and a fourth insulating layer INS4. The display element layer DPL may also include a second bank BNK2 and a light conversion layer CCL.

The bank pattern BNP may be provided on the passivation layer PSV. The bank pattern BNP may overlap the alignment electrodes ALE and may be arranged to be spaced apart from each other in the first direction DR1.

A portion of each of the alignment electrodes ALE may protrude in an upper direction (for example, a third direction DR3) around the light emitting elements LD by the bank pattern BNP. A reflective protrusion pattern may be formed around the light emitting elements LD by the bank pattern BNP and the alignment electrodes ALE thereon, and light efficiency of the pixel PX may be improved.

The bank pattern BNP may include an inorganic insulating layer formed of an inorganic material or an organic insulating layer formed of an organic material. The alignment electrodes ALE (for example, the first, second, and third alignment electrodes ALE1, ALE2, and ALE3) may be formed on the bank pattern BNP.

The alignment electrodes ALE may include at least one conductive material. The alignment electrodes ALE may include conductive materials identical to or different from each other.

Each of the alignment electrodes ALE may be configured as a single layer or multiple layers. For example, the alignment electrodes ALE may include a reflective electrode layer including a reflective conductive material (for example, a metal). The alignment electrodes ALE may also include at least one of a transparent electrode layer disposed on and/or under the reflective electrode layer, and a conductive capping layer covering an upper portion of the reflective electrode layer and/or the transparent electrode layer.

The first insulating layer INS1 may be disposed on the alignment electrodes ALE. In an embodiment, the first insulating layer INS1 may include contact holes (for example, the eighth and ninth contact holes CH8 and CH9 of FIG. 9) for electrically connecting the first and third alignment electrodes ALE1 and ALE3 to the first and second pixel electrodes PE1 and PE2, respectively. In another embodiment, the first insulating layer INS1 may be formed entirely on the display area DA in which the alignment electrodes ALE are formed, and may include openings exposing a portion of each of the first and third alignment electrodes ALE1 and ALE3. In still another embodiment, the first insulating layer INS1 may be locally disposed only under an area in which the light emitting elements LD are arranged.

The first insulating layer INS1 may be configured as a single layer or multiple layers, and may include an inorganic insulating material and/or organic insulating material. In an embodiment, the first insulating layer INS1 may include at least one inorganic insulating material such as silicon nitride ($SiN_x$), silicon oxide ($SiO_x$), and silicon oxynitride ($SiO_xN_y$).

As the alignment electrodes ALE are covered by the first insulating layer INS1, damage to the alignment electrodes ALE may be prevented in a subsequent process. Electrical stability of the alignment electrodes ALE may be also secured.

The first bank BNK1 may be disposed on the alignment electrodes ALE and the first insulating layer INS1. In an embodiment, the first bank BNK1 may include an opening corresponding to each emission area EA, and may surround the emission area EA of each of the sub-pixels SPX1, SPX2, and SPX3.

The light emitting elements LD may be supplied to each emission area EA surrounded by the first bank BNK1. The light emitting elements LD may be aligned between the alignment electrodes ALE by alignment signals applied to the alignment electrodes ALE.

In an embodiment, the light emitting elements LD may be light emitting elements of a first color. For example, all of the light emitting elements LD may be blue light emitting elements emitting blue light.

In case that the first sub-pixel SPX1 is a red sub-pixel, a first light conversion layer CCL1 including a red first light conversion particle QDr (for example, a red quantum dot) may be disposed on the light emitting elements LD of the first sub-pixel SPX1.

In case that the second sub-pixel SPX2 is a green sub-pixel, a second light conversion layer CCL2 including a green second light conversion particle QDg (for example, a green quantum dot) may be disposed on the light emitting elements LD of the second sub-pixel SPX2.

In case that the third sub-pixel SPX3 is a blue sub-pixel, light scattering particles SCT may be disposed on the light emitting elements LD of the third sub-pixel SPX3.

The second insulating layer INS2 (also referred to as an "insulation pattern") may be disposed on a portion of the light emitting elements LD. In an embodiment, the second insulating layer INS2 may be locally disposed on a portion of the light emitting elements LD to expose the first and second ends EP1 and EP2 of the light emitting elements LD aligned between a pair of alignment electrodes ALE.

The second insulating layer INS2 may stably fix the light emitting elements LD and prevent a short circuit between adjacent pixel electrodes PE.

The second insulating layer INS2 may be configured as a single layer or multiple layers, and may include an inorganic insulating material and/or organic insulating material. For example, the second insulating layer INS2 may include various types of organic/inorganic insulating materials such as silicon nitride ($SiN_x$), silicon oxide ($SiO_x$), silicon oxynitride ($SiO_xN_y$), aluminum oxide ($Al_xO_y$), photoresist material, and the like.

The pixel electrodes PE may be formed on the first and second ends EP1 and EP2 of the light emitting elements LD. For example, the first pixel electrode PE1 may be disposed on the first end EP1 of the first light emitting element LD1, and the connection electrode CTE may be disposed on the second end EP2 of the first light emitting element LD1 and the first end EP1 of the second light emitting element LD2. The second pixel electrode PE2 may be disposed on the second end EP2 of the second light emitting element LD2 (refer to FIGS. 9 and 10).

The pixel electrodes PE may be formed on layers identical to or different from each other. For example, as shown in FIG. 10, after the connection electrode CTE is first formed on the second insulating layer INS2, the third insulating layer INS3 covering the connection electrode CTE may be formed, and the first and second pixel electrodes PE1 and PE2 may be formed on the third insulating layer INS3. However, the disclosure is not limited thereto, and an arrangement and/or a formation order of the first pixel electrode PE1, the second pixel electrode PE2, and the connection electrode CTE may be variously changed according to an embodiment.

The pixel electrodes PE may include at least one conductive material. In an embodiment, the pixel electrodes PE may include a transparent conductive material so that light emitted from the light emitting elements LD may pass therethrough.

The light conversion layers CCL may be provided in each emission area EA to be disposed on the light emitting elements LD. The light conversion layers CCL may include at least one of the sub-emission light conversion particles QDr and QDg and/or the light scattering particles SCT to correspond to an emission color of each of the sub-pixels SPX1, SPX2, and SPX3.

The display element layer DPL may further include the second bank BNK2 in the display area DA having an opening corresponding to each emission area EA. The second bank BNK2 may define and/or partition each emission area EA in which each of the light conversion layers CCL is to be formed.

The second bank BNK2 may include a reflective and/or light blocking material such as a black matrix material or the like. The second bank BNK2 may include a material identical to or different from that of the first bank BNK1. A portion overlapping the second bank BNK2 may be the non-emission area NEA.

The light conversion layer CCL may include the light conversion particles QD (or wavelength and/or color conversion particles) that convert a wavelength and/or a color of the light emitted from the light emitting elements LD, and/or the light scattering particles SCT scattering the light emitted from the light emitting elements LD to increase light output efficiency.

As described above, the first light conversion layer CCL1 may include the first light conversion particle QDr. A first color filter CF1 (for example, a red color filter) that selectively transmits red light may be disposed on the first light conversion layer CCL1. Accordingly, the first sub-pixel SPX1 may emit red light. In an embodiment, the first light conversion layer CCL1 may further include the light scattering particles SCT. Accordingly, light efficiency of the first sub-pixel SPX1 may be increased.

The second light conversion layer CCL2 may include the second light conversion particle QDg. A second color filter CF2 (for example, a green color filter) that selectively transmits green light may be disposed on the second light conversion layer CCL2. Accordingly, the second sub-pixel SPX2 may emit green light. In an embodiment, the second light conversion layer CCL2 may further include the light scattering particles SCT. Accordingly, light efficiency of the second sub-pixel SPX2 may be increased.

The third light conversion layer CCL3 may include the light scattering particles SCT. A third color filter CF3 (for example, a blue color filter) that selectively transmits blue light may be disposed on the third light conversion layer CCL3. Accordingly, the third sub-pixel SPX3 may emit blue light.

The fourth insulating layer INS4 may be provided between the light conversion layers CCL and the color filters CF. In an embodiment, the fourth insulating layer INS4 may include an organic and/or inorganic insulating layer, and may substantially planarize a surface of the display element layer DPL. The fourth insulating layer INS4 may protect the light emitting unit EMU and the light conversion layers CCL.

The above-described color filter layer CFL may be disposed on the fourth insulating layer INS4.

In an embodiment, the first, second, and third color filters CF1, CF2, and CF3 may overlap each other in the non-emission area NEA and block light interference between the sub-pixels SPX1, SPX2, and SPX3.

The encapsulation layer ENC may be disposed on the color filter layer CFL. The encapsulation layer ENC may include a fifth insulating layer INS5 comprising an organic and/or inorganic insulating layer. The fifth insulating layer INS5 may be formed to entirely cover the pixel circuit layer PCL, the display element layer DPL, and/or the color filter layer CFL.

FIG. 11 is a schematic cross-sectional view illustrating a display device taken along line I-I' of FIGS. 7 and 8 according to an embodiment of the disclosure.

Referring to FIGS. 7, 8, and 11, in the first sub-pixel SPX1, the first transistor T1 may be electrically connected to the second alignment electrode ALE2 through the sixth contact hole CH6.

A portion of the first, second, and third alignment electrodes ALE1, ALE2, and ALE3 may be formed on the bank pattern BNP.

As described above, the first data line D1 and the first vertical power line VPL1 may be disposed on the substrate SUB, and the first active layer ACT1 may be disposed on the buffer layer BFL. The first gate electrode GE1 overlapping the first active layer ACT1 may be disposed on the gate insulating layer GI.

The upper electrode UE of the storage capacitor Cst and the first horizontal power line HPL1 may be disposed on the interlayer insulating layer ILD. The upper electrode UE of the storage capacitor Cst may be the source electrode of the first transistor T1 and may be connected to the source area of the first active pattern ACT1 through a contact hole CH11.

The first horizontal power line HPL1 may be the drain electrode of the first transistor T1 and may be connected to the drain area of the first active pattern ACT1 through a twelfth contact hole CH12.

In an embodiment, in the first, second, and third sub-pixels SPX1, SPX2, and SPX3, the first vertical power line VPL1 and the first horizontal power line HPL1 may be connected only through the first contact hole CH1. Therefore, a line and circuit element design of the pixel circuit layer PCL may be simplified.

Figure 12:
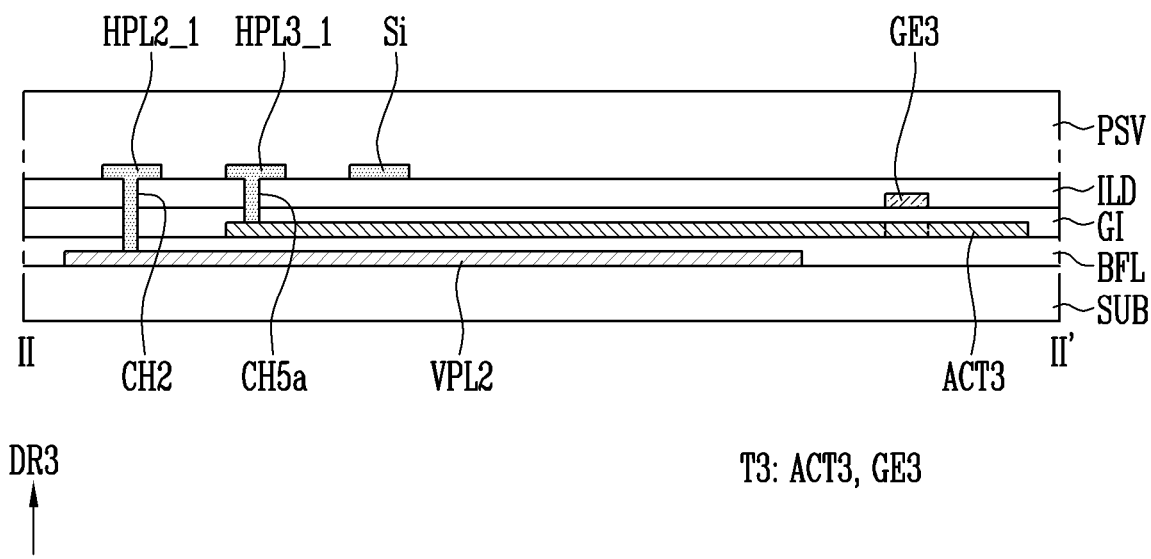
FIG. 12 is a schematic cross-sectional view illustrating a display device taken along line II-II' of FIG. 7 according to an embodiment of the disclosure.

FIG. 12 is a schematic cross-sectional view illustrating a display device taken along line II-II' of FIG. 7 according to an embodiment of the disclosure.

In FIG. 12, repetition of contents overlapping those described with reference to FIGS. 7 to 11 is omitted.

Referring to FIGS. 7, 8, and 12, in the second sub-pixel SPX2, the third transistor T3 of the second sub-pixel SPX2 may be electrically connected to the first third horizontal power line HPL3_1 (hereinafter, a third horizontal power line) through a fifth contact hole CH5a.

The second vertical power line VPL2 that transmits the second power VSS may be disposed on the substrate SUB.

The first second horizontal power line HPL2_1 (hereinafter, a second horizontal power line) may be connected to the second vertical power line VPL2 through the second contact hole CH2.

The third horizontal power line HPL3_1 may be connected to an area (for example, the drain area) of the third active pattern ACT3 of the second sub-pixel SPX2 through the fifth contact hole CH5a. Therefore, the second horizontal power line HPL2_1 and the third horizontal power line HPL3_1 may transmit the second power VSS and the third power Vint, respectively, without a short circuit of the second horizontal power line HPL2_1 and the third horizontal power line HPL3_1.

In an embodiment, in the first, second, and third sub-pixels SPX1, SPX2, and SPX3, the second vertical power line VPL2 and the second horizontal power line HPL2_1 may be connected only through the second contact hole CH2. Therefore, a line and circuit element design of the pixel circuit layer PCL may be simplified.

Figure 13:
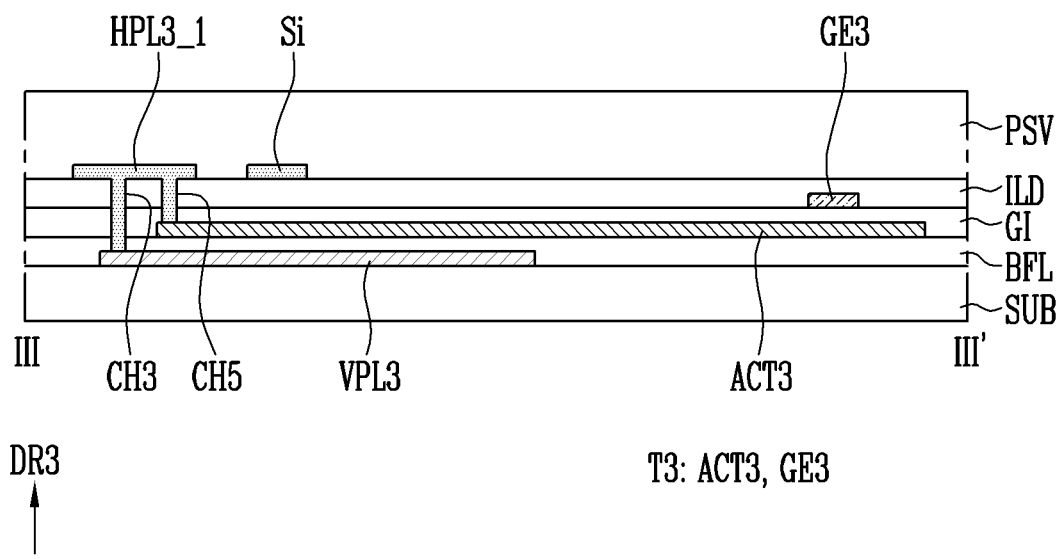
FIG. 13 is a schematic cross-sectional view illustrating a display device taken along line III-III' of FIG. 7 according to an embodiment of the disclosure.

FIG. 13 is a schematic cross-sectional view illustrating a display device taken along line III-III' of FIG. 7 according to an embodiment of the disclosure.

In FIG. 13, repetition of contents overlapping those described with reference to FIGS. 7 to 12 is omitted.

Referring to FIG. 13, the third horizontal power line HPL3_1 may be connected to the third vertical power line VPL3 through the third contact hole CH3.

The third horizontal power line HPL3_1 may be connected to an area (for example, the drain area) of the third active pattern ACT3 of the third sub-pixel SPX3 through the fifth contact hole CH5. Therefore, the second horizontal power line HPL2_1 and the third horizontal power line HPL3_1 may transmit the second power VSS and the third power Vint, respectively, without a short circuit of the second horizontal power line HPL2_1 and the third horizontal power line HPL3_1.

In an embodiment, in the first, second, and third sub-pixels SPX1, SPX2, and SPX3, the third vertical power line VPL3 and the third horizontal power line HPL3_1 may be connected only through the third contact hole CH3. Therefore, a line and circuit element design of the pixel circuit layer PCL may be simplified.

Figure 14:
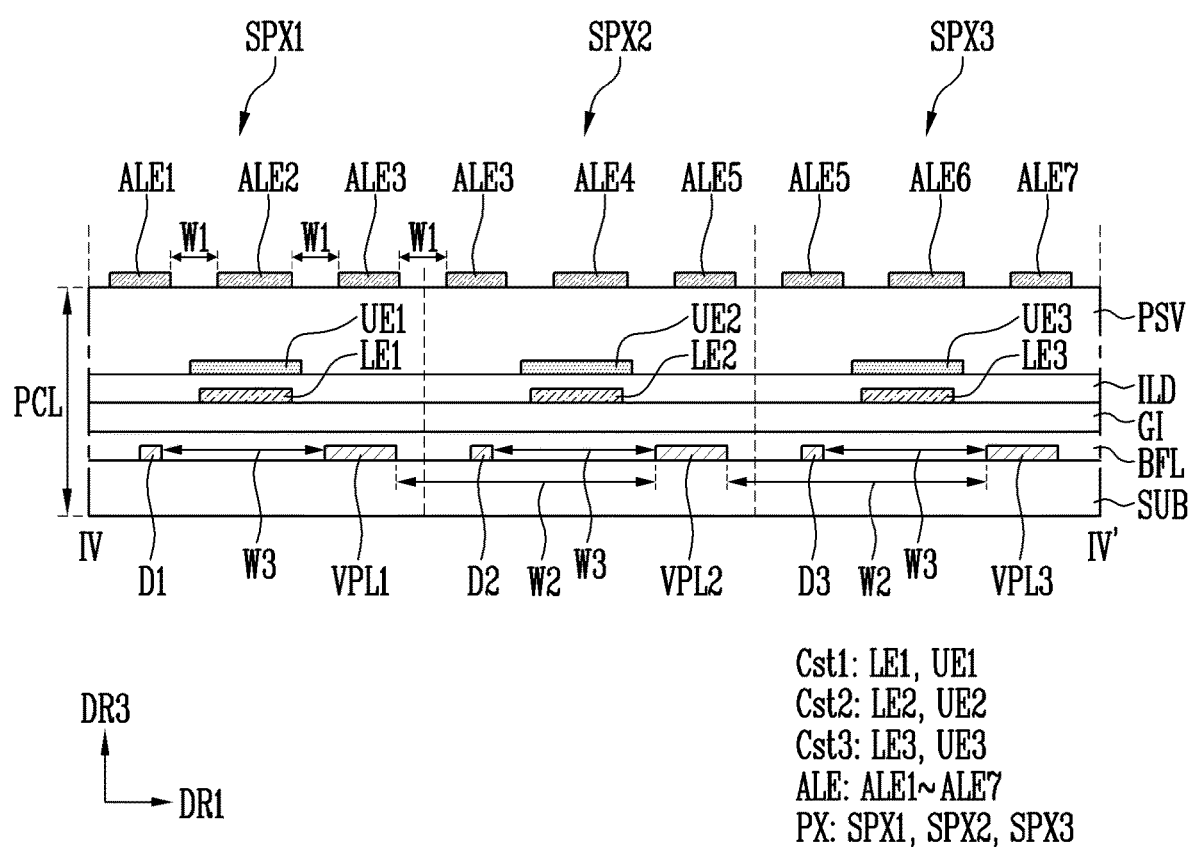
FIG. 14 is a schematic cross-sectional view illustrating a display device taken along line IV-IV' of FIGS. 7 and 8 according to an embodiment of the disclosure.

FIG. 14 is a schematic cross-sectional view illustrating a display device taken along line IV-IV' of FIGS. 7 and 8 according to an embodiment of the disclosure.

In FIG. 14, the bank pattern BNP or the like on which the alignment electrodes ALE are disposed is omitted for convenience of description.

Referring to FIGS. 7, 8, 10, and 14, the pixel PX may include first to seventh alignment electrodes ALE1 to ALE7 disposed on the passivation layer PSV.

Distances between adjacent alignment electrodes ALE may be substantially the same as a first distance W1. Widths and thicknesses of the alignment electrodes ALE in the first direction DR1 may be substantially the same. As shown in FIG. 8, the first distance W1 between the first alignment electrode ALE1 and the second alignment electrode ALE2 may be a width of an opening of the third alignment electrode ALE3 in the first direction DR1.

In an embodiment, planar and cross-sectional designs of pixel circuit layer of the first sub-pixel SPX1, the second sub-pixel SPX2, and the third sub-pixel SPX3 may be substantially the same. For example, the same configuration (conductive layer or the like) may be disposed at the same position of the pixel circuit layer PCL of each of the sub-pixels SPX1, SPX2, and SPX3. For example, a first upper electrode UE1 and a first lower electrode LE1 configuring a first storage capacitor Cst1, a second upper electrode UE2 and a second lower electrode LE2 configuring a second storage capacitor Cst2, and a third upper electrode UE3 and a third lower electrode LE3 configuring a third storage capacitor Cst3 may have a same shape and arrangement within the respective sub-pixels SPX1, SPX2, and SPX3.

Similarly, the data lines D1, D2, and D3 and the vertical power lines VPL1, VPL2, and VPL3 may have a same arrangement within the sub-pixels SPX1, SPX2, and SPX3. In an embodiment, both of a distance between the first vertical power line VPL1 and the second vertical power line VPL2 and a distance between the second vertical power line VPL2 and the third vertical power line VPL3 may be substantially the same as a second distance W2.

All of a distance between the first data line D1 and the first vertical power line VPL1, a distance between the second data line D2 and the second vertical power line VPL2, and a distance between the third data line D3 and the third vertical power lines VPL3 may be substantially the same as a third distance W3.

Therefore, all planar and cross-sectional structures of the pixel circuit layer PCL of the sub-pixels SPX1, SPX2, and SPX3 may be the same. Accordingly, a deviation of electric fields between the alignment electrodes ALE of the sub-pixels SPX1, SPX2, and SPX3 may be minimized, and an alignment deviation of the light emitting elements LD between the sub-pixels SPX1, SPX2, and SPX3 may be minimized.

In FIG. 14, the conductive layers of the pixel circuit layer PCL extend to an opening area between the alignment electrodes ALE, but the disclosure is not limited thereto. For example, in a plan view, the first vertical power line VPL1 may have a shape that occupies up to an opening between the second alignment electrode ALE2 and the third alignment electrode ALE3. However, the disclosure is not limited thereto, a design of the pixel circuit layer PCL may be modified so that lower conductive layers do not overlap a space between the alignment electrodes ALE in consideration of an electric field actually formed between the alignment electrodes ALE.

Figure 15:
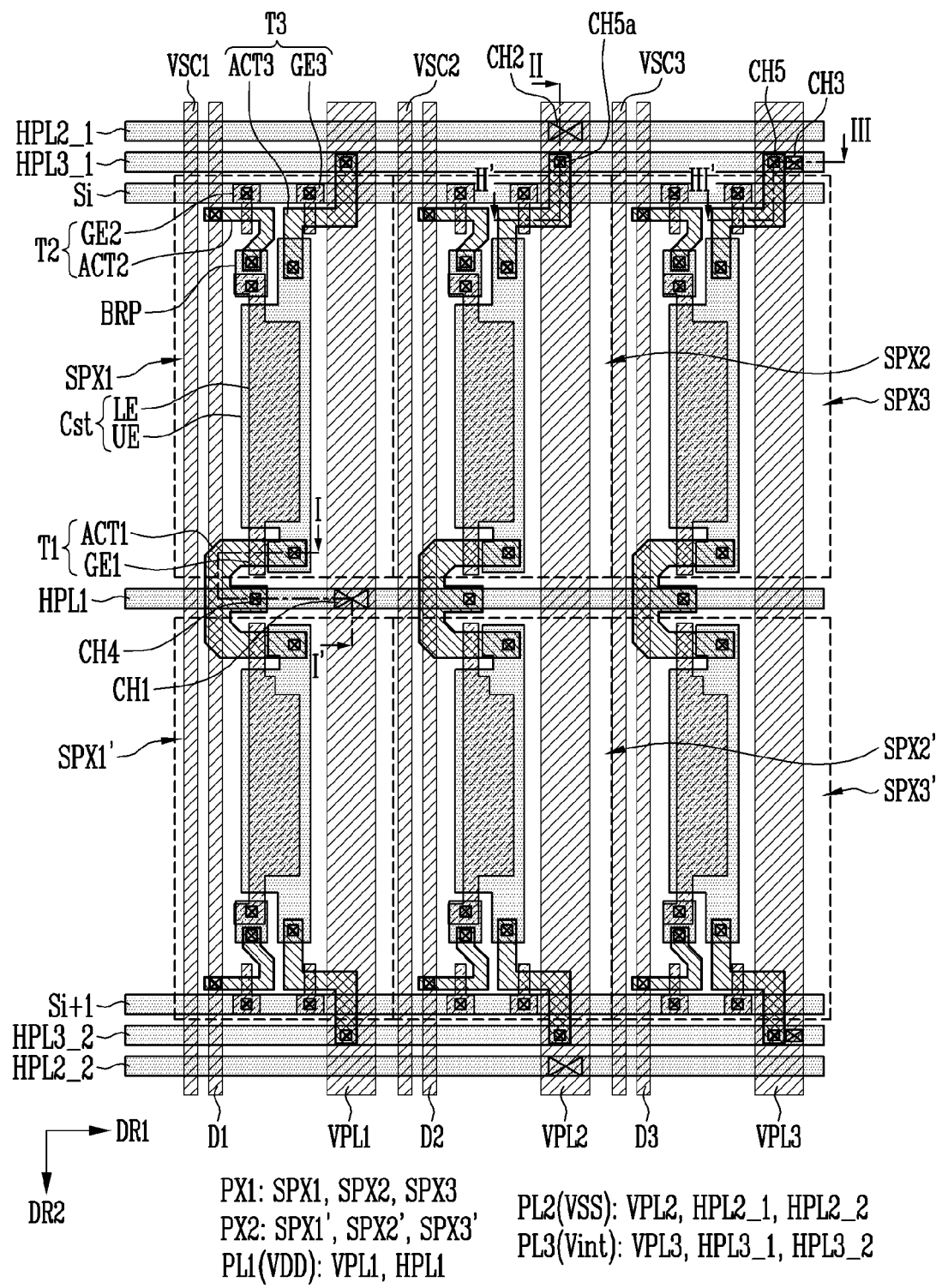
FIG. 15 is a schematic layout diagram illustrating a pixel circuit layer of the display area of the display device of FIG. 3 according to an embodiment of the disclosure.

FIG. 15 is a schematic layout diagram illustrating a pixel circuit layer of the display area of the display device of FIG. 3 according to an embodiment of the disclosure.

In FIG. 15, same reference numerals are used for the components described with reference to FIG. 7, and an overlapping description of these components is omitted.

Referring to FIGS. 3 and 15, the first pixel PX1 may include the first sub-pixel SPX1, the second sub-pixel SPX2, and the third sub-pixel SPX3, and the second pixel PX2 may include the first sub-pixel SPX1', the second sub-pixel SPX2', and the third sub-pixel SPX3'.

In an embodiment, the display device DD may further include vertical scan lines VSC1, VSC2, and VSC3 extending in the second direction. According to an embodiment, the vertical scan lines VSC1, VSC2, and VSC3 may include a same material as the data lines D1, D2, and D3 and may be disposed on a same layer through a same process.

The vertical scan lines VSC1, VSC2, and VSC3 may be applied to a panel having a single side driving (SSD) structure. The SSD structure may be a structure in which a scan driver and a data driver are disposed together on a side of a display panel to implement a narrow bezel.

Each of the vertical scan lines VSC1, VSC2, and VSC3 may be connected to different scan lines. For example, a first vertical scan line VSC1 may be connected to an arbitrary scan line through a contact hole in a portion which is not shown in FIG. 15. A second vertical scan line VSC2 may be connected to a scan line other than the scan line to which the first vertical scan line VSC1 is connected through a contact hole in a portion which is not shown in FIG. 15. A third vertical scan line VSC3 may be connected to a scan line other than the scan line to which the first vertical scan line VSC1 is connected and the scan line to which the second vertical scan line VSC2 is connected through a contact hole in a portion which is not shown in FIG. 15.

Figure 16:
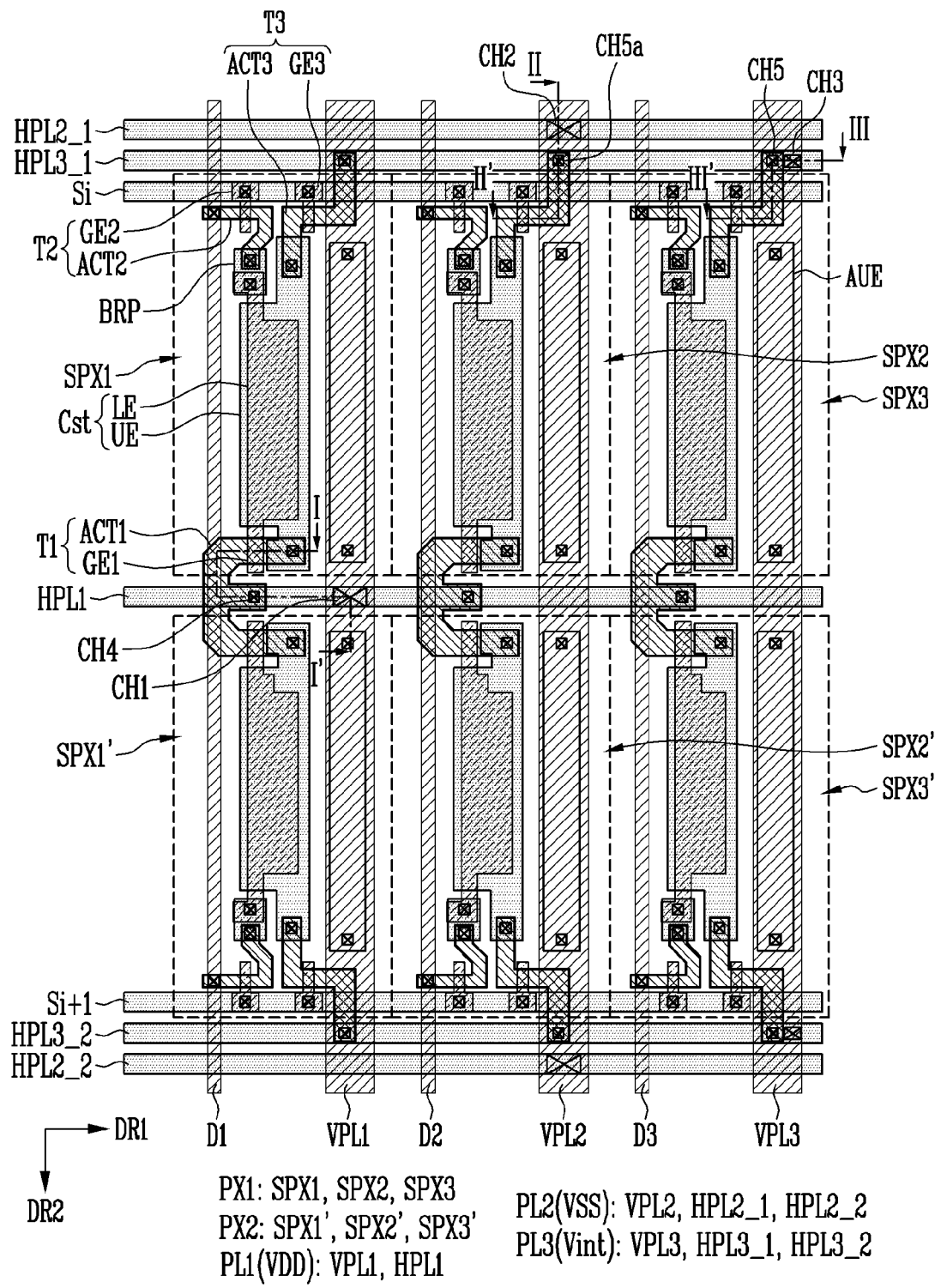
FIG. 16 is a schematic layout diagram illustrating a pixel circuit layer of the display area of the display device of FIG. 3 according to an embodiment of the disclosure.

FIG. 16 is a schematic layout diagram illustrating a pixel circuit layer of the display area of the display device of FIG. 3 according to an embodiment of the disclosure.

In FIG. 16, same reference numerals are used for the components described with reference to FIG. 7, and an overlapping description of these components is omitted.

Referring to FIGS. 3 and 16, the first pixel PX1 may include the first sub-pixel SPX1, the second sub-pixel SPX2, and the third sub-pixel SPX3, and the second pixel PX2 may include the first sub-pixel SPX1', the second sub-pixel SPX2', and the third sub-pixel SPX3'.

In an embodiment, the display device DD may further include an auxiliary electrode AUE disposed on each of the first vertical power line VPL1, the second vertical power line VPL2, and the third vertical power line VPL3. In an embodiment, the auxiliary electrode AUE may include a same material as the horizontal power lines HPL1, HPL2_1, HPL2_2, HPL3_1, and HPL3_2, and may be disposed on a same layer through a same process as the horizontal power lines HPL1, HPL2_1, HPL2_2, HPL3_1, and HPL3_2.

The auxiliary electrode AUE may overlap each of the first vertical power line VPL1, the second vertical power line VPL2, and the third vertical power line VPL3. The auxiliary electrode AUE disposed in the first sub-pixel SPX1 may be connected to the first vertical power line VPL1 through at least one contact hole. The auxiliary electrode AUE disposed in the second sub-pixel SPX2 may be connected to the second vertical power line VPL2 through at least one contact hole. The auxiliary electrode AUE disposed in the third sub-pixel SPX3 may be connected to the third vertical power line VPL3 through at least one contact hole.

Therefore, a line resistance in each of the vertical power lines VPL1, VPL2, and VPL3 may be reduced.

As described above, in the display device DD according to embodiments of the disclosure, only one of each of the vertical power lines VPL1, VPL2, and VPL3 respectively transmitting the first power VDD, the second power VSS, and the third power Vint and extending in the second direction DR2 may be disposed in a pixel. Therefore, the number of lines in the sub-pixels SPX1, SPX2, and SPX3 may be reduced, and a design of the pixel circuit layer may be simplified. Also, the planar and cross-sectional layouts of the pixel circuit layer PCL of the sub-pixels of the display device DD may be unified. Therefore, a deviation between the sub-pixels SPX1, SPX2, and SPX3 of the electric fields formed by the alignment electrodes ALE may be minimized or reduced, and the alignment deviation of the light emitting elements LD between the sub-pixels SPX1, SPX2, and SPX3 may be minimized.

Since a planar shape of the pixel circuit layer PCL is designed to be symmetrical with respect to the horizontal power lines (for example, the first horizontal power line or the second horizontal power line), the integration degree of the metal lines may be reduced. Therefore, a yield and resolution of the display device DD may be increased.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments.

What is claimed is:
1. A display device comprising:
pixel rows comprising a first pixel row, a second pixel row and a third pixel row, wherein each of the pixel rows comprises:
a pixel including a first sub-pixel, a second sub-pixel, and a third sub-pixel arranged in a first direction and emitting light of a first color, light of a second color, and light of a third color, respectively;
a first vertical power line extending in a second direction different from the first direction, overlapping an alignment electrode of the first sub-pixel in a thickness direction of the pixel, and transmitting first power;
a second vertical power line extending in the second direction, overlapping an alignment electrode of the second sub-pixel in the thickness direction, and transmitting second power;
a third vertical power line extending in the second direction, overlapping an alignment electrode of the third sub-pixel in the thickness direction, and transmitting third power;
a first horizontal power line extending in the first direction and electrically connected to the first vertical power line through a first contact hole;
a second horizontal power line extending in the first direction and electrically connected to the second vertical power line through a second contact hole; and
a third horizontal power line extending in the first direction and electrically connected to the third vertical power line through a third contact hole, and
voltages of the first power, the second power, and the third power are different from each other.
2. The display device according to claim 1, wherein
the alignment electrodes of the first sub-pixel, the second sub-pixel, and the third sub-pixel are disposed on the first to third vertical power lines and the first to third horizontal power lines, arranged in the first direction, and extending in the second direction, and
each of the first sub-pixel, the second sub-pixel, and the third sub-pixel comprises:
light emitting elements disposed between adjacent alignment electrodes and arranged in the second direction in a plan view.
3. The display device according to claim 2, wherein a distance between the first vertical power line and the second vertical power line in the first direction and a distance between the second vertical power line and the third vertical power line in the first direction are same.
4. The display device according to claim 2, wherein shapes of the first vertical power line, the second vertical power line, and the third vertical power line in a plan view are same.
5. The display device according to claim 2, wherein the first horizontal power lines of the first pixel row and the second pixel row are integral with each other and disposed between the first pixel row and the second pixel row adjacent to each other.

6. The display device according to claim 5, wherein
each of the first sub-pixel, the second sub-pixel, and the third sub-pixel includes a pixel circuit driving the light emitting elements, and
each of the pixel circuit comprises:
  a first transistor including a first electrode electrically connected to the first horizontal power line and a second electrode electrically connected to the light emitting elements, and generating a driving current based on a data signal;
  a second transistor electrically connected between a gate electrode of the first transistor and a data line providing the data signal, and including a gate electrode electrically connected to a scan line extending in the first direction;
  a third transistor electrically connected between the third horizontal power line and the second electrode of the first transistor, and including a gate electrode electrically connected to the scan line; and
  a storage capacitor electrically connected between the gate electrode of the first transistor and the second electrode of the first transistor.

7. The display device according to claim 6, wherein
the pixel circuit of the first pixel row and the pixel circuit of the second pixel row are symmetrical with respect to the first horizontal power line of the first pixel row, and
the second horizontal power line, the third horizontal power line, and the scan line are not disposed between the first pixel row and the second pixel row.

8. The display device according to claim 6, wherein the first electrode of the first transistor of the first pixel row and the first electrode of the first transistor of the second pixel row are integral with each other, and are electrically connected to the first horizontal power line of the first pixel row through a fourth contact hole.

9. The display device according to claim 6, wherein the second horizontal power lines of the second pixel row and the third pixel row are integral with each other and disposed between the second pixel row and the third pixel row adjacent to each other.

10. The display device according to claim 9, wherein
the pixel circuit of the second pixel row and the pixel circuit of the third pixel row are symmetrical with respect to the second horizontal power line of the second pixel row, and
the first horizontal power line is not disposed between the second pixel row and the third pixel row.

11. The display device according to claim 9, further comprising:
a scan line of the second pixel row and a scan line of the third pixel row, each disposed between the second pixel row and the third pixel row.

12. The display device according to claim 9, wherein the third horizontal power line of the second pixel row and the third horizontal power line of the third pixel row are disposed between the second pixel row and the third pixel row.

13. The display device according to claim 9, wherein each of the first vertical power line, the second vertical power line, and the third vertical power line is disposed in the pixel.

14. The display device according to claim 2, wherein distances between adjacent ones of the alignment electrodes in the first direction are same.

15. A display device comprising:
pixel rows comprising a first pixel row, a second pixel row and a third pixel row, wherein each of the pixel rows comprises:
  a pixel including a first sub-pixel, a second sub-pixel, and a third sub-pixel arranged in a first direction and emitting light of a first color, light of a second color, and light of a third color, respectively;
  a first vertical power line extending in a second direction different from the first direction, overlapping an alignment electrode of the first sub-pixel in a thickness direction of the pixel, and transmitting first power;
  a second vertical power line extending in the second direction, overlapping an alignment electrode of the second sub-pixel in the thickness direction, and transmitting second power;
  a third vertical power line extending in the second direction, overlapping an alignment electrode of the third sub-pixel in the thickness direction, and transmitting third power;
  a first horizontal power line extending in the first direction and electrically connected to the first vertical power line through a first contact hole;
  a second horizontal power line extending in the first direction and electrically connected to the second vertical power line through a second contact hole; and
  a third horizontal power line extending in the first direction and electrically connected to the third vertical power line through a third contact hole,
the first horizontal power lines of the first pixel row and the second pixel row are integral with each other and disposed between the first pixel row and the second pixel row adjacent to each other,
the second horizontal power lines of the second pixel row and the third pixel row are integral with each other and disposed between the second pixel row and the third pixel row adjacent to each other, and
the third horizontal power lines of the second pixel row and the third pixel row are disposed between the second pixel row and the third pixel row.

16. The display device according to claim 15, wherein each of the first sub-pixel, the second sub-pixel, and the third sub-pixel comprises:
a pixel circuit layer including transistors generating a driving current based on the first to third powers; and
a display element layer disposed on the pixel circuit layer and including light emitting elements.

17. The display device according to claim 16, wherein
the pixel circuit layer of the first pixel row and the pixel circuit layer of the second pixel row are symmetrical with respect to the first horizontal power line of the first pixel row, and
the pixel circuit layer of the second pixel row and the pixel circuit layer of the third pixel row are symmetrical with respect to the second horizontal power line of the second pixel row.

18. The display device according to claim 16, wherein the display element layer includes the alignment electrodes of the first sub-pixel, the second sub-pixel, and the third sub-pixel disposed between the pixel circuit layer and the light emitting elements, arranged in the first direction, and extending in the second direction.

19. The display device according to claim 18, wherein voltages of the first power, the second power, and the third power are different from each other.

20. The display device according to claim 18, wherein a distance between the first vertical power line and the second vertical power line in the first direction and a distance between the second vertical power line and the third vertical power line in the first direction are same.

\* \* \* \* \*